(12) United States Patent
Yin et al.

(10) Patent No.: US 6,352,049 B1
(45) Date of Patent: Mar. 5, 2002

(54) PLASMA ASSISTED PROCESSING CHAMBER WITH SEPARATE CONTROL OF SPECIES DENSITY

(75) Inventors: Gerald Yin, Cupertino; Arnold Kolandenko, San Francisco; Hong Ching Shan; Peter Loewenhardt, both of San Jose; Chii Lee, Fremont; Yan Ye, Campbell; Xueyan Qian, Milpitas; Songlin Xu; Arthur Chen, both of Fremont; Arthur Sato, San Jose; Michael Grimbergen, Redwood City; Diana Ma, Saratoga; John Yamartino, Palo Alto; Chun Yan, Santa Clara; Wade Zawalski, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/119,417

(22) Filed: Jul. 20, 1998

Related U.S. Application Data

(63) Continuation-in-part of application No. 09/020,960, filed on Feb. 9, 1998.

(51) Int. Cl.$^7$ .............................................. C23E 16/48
(52) U.S. Cl. ..................... 118/723 MP; 118/723 AN; 118/723 IR; 156/345
(58) Field of Search .................. 118/723 MP, 723 ME, 118/723 MR, 723 MA, 723 AN, 723 ER, 723 IR; 156/345; 204/298.37, 298.16

(56) References Cited

U.S. PATENT DOCUMENTS

| 4,123,316 A | 10/1978 | Tsuchimoto |
| 4,262,631 A | 4/1981 | Kubacki |
| 4,282,267 A | 8/1981 | Kuyel |
| 4,371,412 A | 2/1983 | Nishizawa |

(List continued on next page.)

FOREIGN PATENT DOCUMENTS

| EP | 0 367 568 | 5/1990 |
| EP | 0 451 943 A2 | 10/1991 |
| EP | 0 488 393 A2 | 6/1992 |
| EP | 0 522 296 A2 | 1/1993 |
| FR | 2 614 041 | 10/1988 |

(List continued on next page.)

OTHER PUBLICATIONS

G.R. Tynan, A.D. Bailey III, G.A. Campbell, R. Charatan, A. de Chambrier, G. Gibson, D.J. Hemker, K. Jones, A. Kuthi, C. Lee, M. Wilcoxson. Characterization of an Azimuthally Symmetric Helicon Wave High Density Plasma Source. Trikon Technologies, Jul. 1997.

Patent Abstracts of Japan, Publication No. 04130628, Jan. 5, 1992 (Sanyo Electric Co Ltd).

(List continued on next page.)

*Primary Examiner*—Richard Bueker
(74) *Attorney, Agent, or Firm*—Michaelson and Wallace

(57) ABSTRACT

The present invention provides an apparatus and method, for plasma assisted processing of a workpiece, which provides for separate control of species density within a processing plasma. The present invention has a processing chamber and at least one collateral chamber. The collateral chamber is capable of generating a collateral plasma and delivering it to the processing chamber. To control the densities of the particle species within the processing chamber the present invention may have: a filter interposed between the collateral chamber and the processing chamber, primary chamber source power, several collateral chambers providing separate inputs to the processing chamber, or combinations thereof. Collateral plasma may be: filtered, combined with primary chamber generated plasma, combined with another collateral plasma, or combinations thereof to separately control the densities of the species comprising the processing plasma.

24 Claims, 10 Drawing Sheets

U.S. PATENT DOCUMENTS

| | | | |
|---|---|---|---|
| 4,689,112 A | | 8/1987 | Berskin |
| 4,810,935 A | | 3/1989 | Boswell |
| 4,859,908 A | | 8/1989 | Yoshida et al. |
| 4,918,031 A | | 4/1990 | Flamm et al. |
| 4,990,229 A | | 2/1991 | Campbell et al. |
| 5,091,049 A | | 2/1992 | Campbell et al. |
| 5,114,529 A | | 5/1992 | Masuyama et al. |
| 5,122,251 A | | 6/1992 | Campbell et al. |
| 5,273,609 A | | 12/1993 | Moslehi |
| 5,284,544 A | | 2/1994 | Mizutani et al. |
| 5,421,891 A | | 6/1995 | Campbell et al. |
| 5,429,070 A | | 7/1995 | Campbell et al. |
| 5,464,499 A | | 11/1995 | Moslehi et al. |
| 5,292,370 A | * | 4/1996 | Tsai et al. ............. 118/723 MP |
| 5,512,102 A | * | 4/1996 | Yamazaki ........... 118/723 MW |
| 5,521,351 A | | 5/1996 | Mahoney |
| 5,556,501 A | * | 9/1996 | Collins et al. ............... 156/345 |
| 5,573,597 A | * | 11/1996 | Lantsman ............ 118/723 MP |
| 5,587,038 A | | 12/1996 | Cecchi et al. |
| 5,651,825 A | | 7/1997 | Nakahigashi et al. |
| 5,885,356 A | | 3/1999 | Zhao et al. |

FOREIGN PATENT DOCUMENTS

| | | |
|---|---|---|
| JP | 64-46916 | 2/1989 |
| JP | 62-203028 | 2/1989 |
| JP | 03107480 A | 7/1991 |
| WO | WO 86/06923 | 11/1986 |
| WO | WO 92/14258 | 8/1992 |
| WO | WO 96/15545 | 5/1996 |
| WO | WO 99/01888 | 1/1999 |

OTHER PUBLICATIONS

Patent Abstracts of Japan, Publication No. 06084837, Mar. 25, 1994 (Mitsubishi Electric Corp).

Patents Abstracts of Japan, Publication No. 06280059, Apr. 10, 1994 (Kawasaki Heavy Ind Ltd).

Patent Abstracts of Japan, Publication No. 09092643, Apr. 4, 1997 (Toshiba Corp).

Patent Abstracts of Japan, Publication No. 58202533, Nov. 25, 1983 (Hitachi Ltd).

Patent Abstracts of Japan, Publication No. 59121747, Jul. 13, 1984 (Fujitsu Ltd).

* cited by examiner

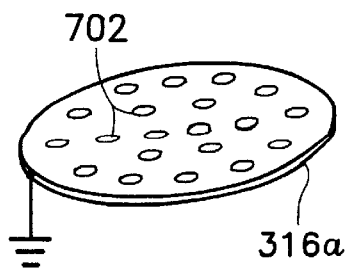
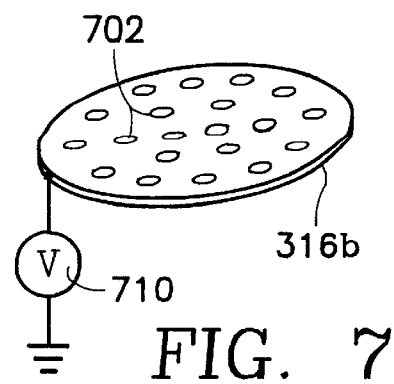
FIG. 7A          FIG. 7B
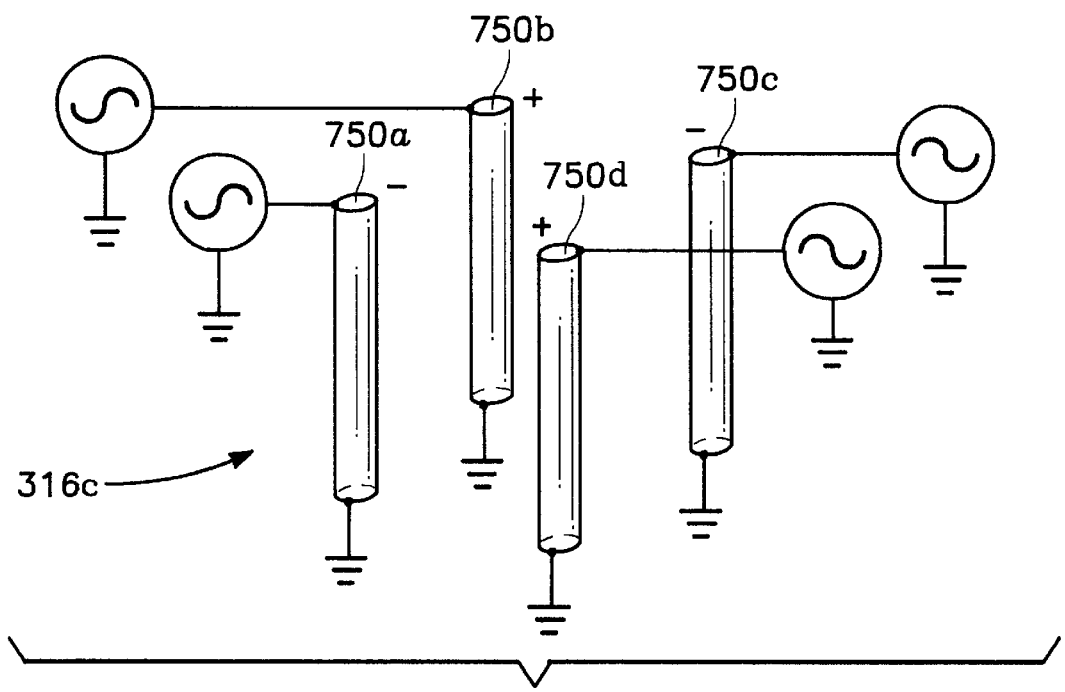
FIG. 7C
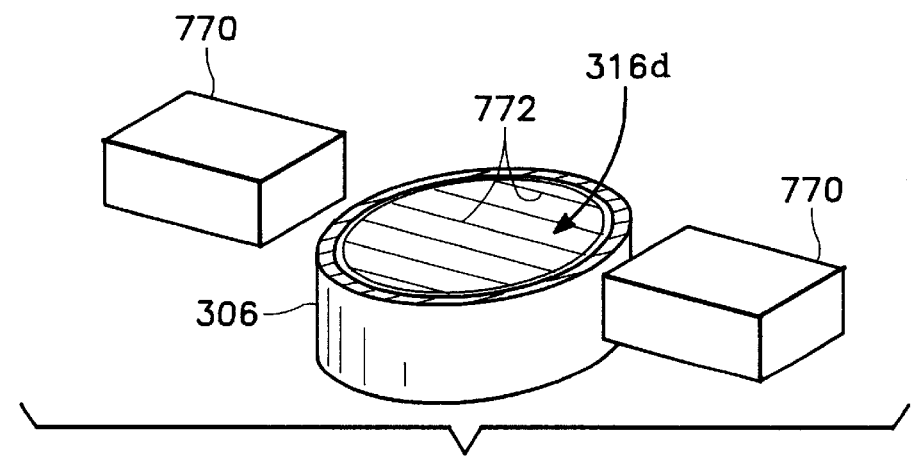
FIG. 7D

PLASMA ASSISTED PROCESSING CHAMBER WITH SEPARATE CONTROL OF SPECIES DENSITY

CROSS REFERENCE

This is a Continuation-in-Part of U.S. patent application Ser. No. 09/020,960, filed Feb. 9, 1998, entitled PLASMA ASSISTED PROCESSING CHAMBER WITH SEPARATE CONTROL OF CHARGED PARTICLE DENSITY AND NEUTRAL DENSITY, herein incorporated by reference in its entirety.

BACKGROUND

1. Technical Field

The invention is related to a plasma reactor used for etching and/or deposition of a film on to a workpiece, and more particularly to such a reactor wherein the density of species within the primary processing chamber of the reactor can be independently controlled.

2. Background Art

A plasma reactor may be employed to perform various processes on a workpiece, such as a semiconductor wafer during the fabrication of microelectronic devices on the workpiece. The wafer is placed inside a vacuum chamber of the reactor and processing gases are introduced. The gases are irradiated with electromagnetic energy to ignite and maintain a plasma. Depending upon the composition of the gases from which the plasma is formed, the plasma may be employed to etch a particular material from the workpiece or may be employed to deposit a thin film layer of material onto the workpiece.

In the case where the plasma reactor is used for etching, examples of typical processing gases employed as etchants include $Cl_2$, $BCl_3$, $CF_4$, $SF_6$, $NF_3$, HBr, and various $C_xH_yF_z$ gases, among others. These gases, however, are not chemically reactive enough in these forms to satisfactorily etch the materials desired to be removed from the workpiece undergoing processing in the reactor. This is where the plasma comes into play.

Process gases are irradiated with electromagnetic energy to ignite and maintain a plasma. Species of neutral and charged particles, as well as other particles and substances, are created in the plasma from the processing gases. For example, if $Cl_2$ is used as the process gas, the following species of neutral and charged particles may be present in the chamber:

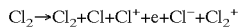

$$Cl_2 \rightarrow Cl_2 + Cl + Cl^+ + e + Cl^- + Cl_2^+$$

Neutrals formed from the etchant gases, such as Cl, F and Br, are extremely unstable and reactive, and can be effectively used to chemically react with materials on the workpiece to produce gaseous substances, thereby in effect removing or etching the material from the workpiece. For example, in the case where it is desired to etch silicon from the surface of a semiconductor wafer, $Cl_2$ can be symmetrically dissociated to form Cl neutrals in the plasma. These Cl neutrals will react with the silicon of the wafer according to the following formula:

$$Si + XCl \rightarrow SiCl_x, X=2,4 \qquad (1)$$

The product, $SiCl_x$ is a gas that is eventually evacuated from the processing chamber.

The foregoing reaction, however, may not occur unless sufficient energy is added. This energy can be in the form of heat, but typically in a plasma assisted etch process, the majority of this energy comes from a physical bombardment of the surface of the wafer. The physical bombardment is the task performed by the charged particles also formed in the plasma from the processing gases. Typically, charged particles are drawn toward the wafer via a bias power applied to the wafer support to enhance the bombardment and create a desired directionality to it—usually normal to the upper surface of the wafer. These charged particles not only provide the energy that fuels the chemical etch process associated with the etchant gas neutrals, but also physically remove material from the surface of the wafer as a result of the particles impact with the wafer.

The charged particles need not be exclusively formed from etchant gases. Any charged particle can be made to bombard the wafer and create the desired effect regardless of whether it will chemically react with the material to be etched. For example, when more charged particles than can be obtained from the etchant gases alone are required for a particular etch process, a non-reactive gas such as argon may be introduced. The argon forms charged particles in the plasma. Although the introduced argon is not chemically reactive with the wafer materials, it provides the desired boost in the overall availability of charged particles used to bombard the wafer.

The concentration or density in the plasma of both the neutral particles formed from the etchant gases and the charged particles formed from all of the processing gases will play a significant role in the etching process and in determining the characteristics exhibited by the etched workpiece. For example, both act to etch material from the workpiece. Therefore, an increase in density of all will have the effect of increasing the overall etch rate—often a desirable effect.

It must be noted, however, that the physical bombardment of the workpiece by the charged particles will also etch materials that may not be intended to be removed. Thus, an increase in the charged particle density can result in damage to the devices being formed on the workpiece, even though the etch rate of the materials intended to be etched would increase. As a result, it can be more advantageous to increase the overall etch rate by increasing only the density of the etchant gas neutrals in the plasma.

The relative densities of the etchant gas neutral and the charged particle species formed in the plasma will also have profound effects, for example, on etch process characteristics such as etch selectivity, etch feature profile, and etch rate microloading.

The term etch selectivity refers to the ratio of etch rates of two different materials on a workpiece undergoing etching in the plasma reactor. To form features and patterns in the various layers of a workpiece, the etch process must be selective so that some materials are etched, while others are not. In one common scenario, it is desired that a silicon layer on a workpiece be etched much faster than photoresist or oxygen-containing layers of the workpiece so as to etch a pattern into the silicon. This is referred to as a high silicon-to-photoresist and silicon-to-oxide selectivity, respectively.

The following example of etching a hole through a silicon layer to an underlying gate oxide layer on a semiconductor wafer, illustrates one example of the importance of high selectivity. Prior to etching, a layer of photoresist material is formed over the surface of the silicon layer over those areas that are not to be etched. Accordingly, there is no photoresist formed in the area where the hole is to be etched. The desired result of the etching process is to quickly etch through the silicon layer where the hole is to be formed, but not to significantly etch the surrounding photoresist, or the underlying gate oxide layer. Thus, a high silicon-to-photoresist and silicon-to-oxide etch selectivity is desired. If an adequate level of selectivity is not maintained, a so-called "punch through" condition can result wherein the photoresist or oxide layer is etched through causing damage to the device being formed on the workpiece.

The densities of the plasma species have a significant impact on the selectivity exhibited during an etching process. For example, if the process chemistry is such that the etchant gas neutrals chemically react with the material to be etched (e.g. silicon) to a greater extent than other materials (e.g. photoresist and oxide), then having a high density of neutral species will help achieve the desired selectivity by causing an increased etch rate of the material being etched in comparison to the other materials. Conversely, since charged particles remove material from the workpiece surface through physical impact, they tend to etch all the various materials of the workpiece equally. Thus, a greater density of the charged particle species in the plasma can cause a greater etch rate of all the workpiece materials.

Accordingly, an increase in etchant gas neutral species under certain conditions can increase selectivity, while a decrease in the neutral species likewise can decrease selectivity. Whereas, an increase in the density of charged particle species under certain conditions can cause a decrease in selectivity, a decrease in charged particle species under certain conditions can cause an increase in selectivity. Therefore, one way of optimizing the desired selectivity of an etch process would be to increase the ratio of etchant gas neutral to the charged particle species in the plasma to the point where there are just enough of the charged particles to facilitate the reaction of the etchant gas neutrals with the material to be etched, but no more.

The etch feature profile exhibited by an etch workpiece will also depend heavily on the relative densities of etchant gas neutral and charged particle species in the plasma. The term etch feature profile refers the angle of a sidewall of a feature etched into a layer of material on the workpiece in relation to the surface plane of the workpiece. This angle can vary between a severe undercut, where the sidewall forms an acute angle with the surface plane of the workpiece, to a significant outward taper where the sidewall forms an obtuse angle with the surface plane. Typically, a straight profile is desired where the feature sidewall forms a 90 degree angle with the surface plane of the workpiece.

The undercut profile occurs when etchant gas neutrals, being chemically reactive with the material into which a feature is etched, cut into the material underneath the overlying photoresist layer down to an underlayer (such as the gate oxide layer in the previously-described silicon etch process). The greater the density of the etchant gas neutral species, the greater the undercut. Often the undercutting potential of the etchant gas neutrals is mitigated by the deposition of a passivation material onto the material being etch. Essentially, the passivation material, which is typically formed in the plasma, deposits on the surfaces of the workpiece and has the effect of resisting etching by the etchant gas neutrals. For example, in the silicon etch scenario described previously, oxygen or nitrogen is often introduced as part of the processing gases. The oxygen or nitrogen reacts with the silicon etched from the semiconductor wafer (or introduced into the plasma by other means) to form various silicon and oxygen or silicon and nitrogen containing materials, respectively. These materials deposit in varying degrees onto the surface of the wafer and resist the etching effects of the etchant gas neutrals. Due to the typical chemistries involved and the action of the bombarding charged particle species, the passivation materials tend to form more readily on the sidewalls of a feature formed in the material being etched, than on the bottom of the feature. This results in a lower etch rate of the feature sidewall, and so a decreased tendency to form an undercut profile. If the etchant neutral density is too high, however, this passivation process may be insufficient to prevent an undercut etch profile.

Charged particle species can have just the opposite effect on the etch feature profile. An increase in the density of charged particle species in the plasma can have create the aforementioned outwardly tapered profile. This can occur as the impact of the charged particles bombarding the bottom of a etch feature removes material that can subsequently redeposit on the sidewalls of the feature. In this way, the outwardly tapered profile can occur.

Thus, one way of creating the desired etch profile angle would be to balance the relative densities of the etchant gas neutral and charged particle species within in the plasma. In other words, the concentration of etchant gas neutral and charged particle species would be made such that the desired etch profile is produced given the opposing effects each has on the profile.

The relative densities of etchant gas neutral and charged particle species in the plasma also have an effect on the etch rate microloading exhibited by an etched workpiece. Etch rate microloading refers to the phenomenon wherein the etch rate tends to be different in areas of dense, closely-spaced etch features on the workpiece than in areas with more widely-spaced features. This can result in an undesirable non-uniformity in the etch depth of features formed in the layer of material being etched. Etch rate microloading is a complex phenomenon. It is known, however, that varying the ratio of etchant gas neutral to charged particle species in the plasma results in a change in the severity of the etch rate microloading.

Accordingly, the ability to vary the densities of the etchant gas neutral and the charged particle species within in the plasma could be advantageously used to ameliorate the etch rate microloading effect.

As can be surmised from the forgoing background, the ability to control the densities of the etchant gas neutral and charged particle species existent in the plasma is very desirable. Establishing a particular neutrals-to-charged particles ratio, for example, can optimize such process characteristics as etch rate, selectivity, etch feature profile, and etch rate microloading. Furthermore, specific charged particle species ratios and neutral species ratios may even further enhance the aforementioned, or other, process characteristics.

Until now, however, the relative densities of the particle species formed within a plasma have been inexorably tied together because, among other limitations, the dissociation rate (i.e. the rate at which neutrals are generated in the plasma) and the ionization rate (i.e. the rate at which charged particles are generated in the plasma) are both dependent upon the level of power coupled into the processing chamber. The density of the etchant gas neutrals increases with increasing power input into the reactor. Unfortunately, any increase in the power input also increases the density of charged particles in the plasma. Likewise, the densities of the different neutral particles, or of the different ionized particles are coupled. As discussed above, many advantageous etch characteristics are dependant upon creating a particular ratio between the densities of the etchant gas neutral and charged particle species, including the ratio between different neutral particle species, or between different charged particle species. This often may entail increasing the density of one species while decreasing the density of the another—something that cannot be accomplished with current plasma reactors and etch processes.

With current reactors, charged particle and neutral particle species densities may be controlled by adjusting reactor parameters, such as source power, chamber pressure, and temperature. Adjusting these parameters, however, affects plasma density and plasma ion energy. Therefore, plasma density and plasma ion energy are coupled to species densities. In reactors that employ only a capacitive power source to generate and sustain the plasma, the three characteristics-plasma density, ion energy, and species densities, are coupled together. For example, increasing source power to increase plasma density correspondingly increases ion energy and the charged-to-neutral particle density ratio. Therefore, adjusting source power or pressure to change one of the characteristics affects the other two.

Other reactors, such as an inductively coupled plasma reactor, which utilize two power sources to control plasma characteristics, provide greater control of plasma characteristics. Using a second source, such as an inductively coupled power source, along with a capacitive power source allows plasma density and plasma ion energy to be decoupled. In other words, plasma density and ion energy may be separately controlled. In these reactors, however, species densities are still coupled to plasma density and ion energy.

Furthermore, neither type of reactor allows control of the density of the specific species of charged or neutral particles within the plasma, such as the ratio of $Cl^+$ to $Cl_2^+$. Control of the densities of specific species of charged or neutral particles would provide even greater control of etch or deposition results thereby improving workpiece processing.

Accordingly, there is a need for a plasma reactor design and etch process that decouples control of plasma species densities, thereby allowing the ratio of these densities to be manipulated so as to optimize process characteristics such as etch rate, selectivity, etch feature profile, etch rate microloading, and more.

BRIEF SUMMARY OF THE INVENTION

The present invention provides an apparatus and method for plasma assisted processing of a workpiece in a plasma reactor. The present invention provides for separate control of species density of a processing plasma.

In a preferred embodiment of the present invention, the plasma reactor of the present invention has a primary processing chamber and at least one collateral source chamber. The collateral source chamber is capable of generating a collateral plasma and is coupled to the primary chamber. The collateral plasma is delivered via the coupling to the primary processing chamber for processing a workpiece. The densities of the neutral and charge particle species within the primary processing chamber plasma may be controlled in several ways.

A filter may be employed to filter the collateral plasma. The filter is interposed between the collateral source chamber and the primary processing chamber. The filter is capable of selectively filtering charged particles from the collateral plasma. The filter may filter some or all of the charged particles. The filter may filter charged particles species by mass and velocity. The filtered collateral plasma is then delivered to the primary processing chamber to provide the desired primary processing plasma densities.

The primary processing chamber also may be capable of generating a primary plasma. The incoming collateral plasma is mixed with the primary chamber generated primary plasma to form the primary processing plasma. The species densities within the primary processing plasma may be adjusted by adjusting the densities of collateral source plasma and the primary chamber generated plasma. The filter may be employed to selectively filter the charged species from the collateral plasma prior to entry into the primary processing chamber.

The present invention may have several collateral source chambers and provide separate plasmas to the primary processing chamber. The densities of the collateral source plasmas are adjusted, or filtered, so that the combined plasmas provide the desired species densities within the primary processing chamber.

Species densities within the primary processing chamber also may be adjusted by combining other neutral radical species inputs, such as thermally dissociated species, to the primary chamber for combination with collateral source chamber plasma.

The present invention may utilize any known reactor layout or method which utilizes plasma for processing a workpiece to generate the desired plasmas.

BRIEF DESCRIPTION OF THE DRAWINGS

FIG. 7A is a perspective view of a grounded grid type recombination filter of the present invention.

FIG. 7B is a perspective view of a biased grid type recombination filter of the present invention.

FIG. 7C is a perspective view of an electric field quadrupole type filter of the present invention.

FIG. 7D is a perspective of a magnetic type filter of the present invention.

DETAILED DESCRIPTION OF THE INVENTION

In the following description of the preferred embodiments of the present invention, reference is made to the accompanying drawings which form a part hereof, and in which is shown by way of illustration specific embodiments in which the invention may be practiced. It is understood that other embodiments may be utilized and structural changes may be made without departing from the scope of the present invention.

Figure 1:
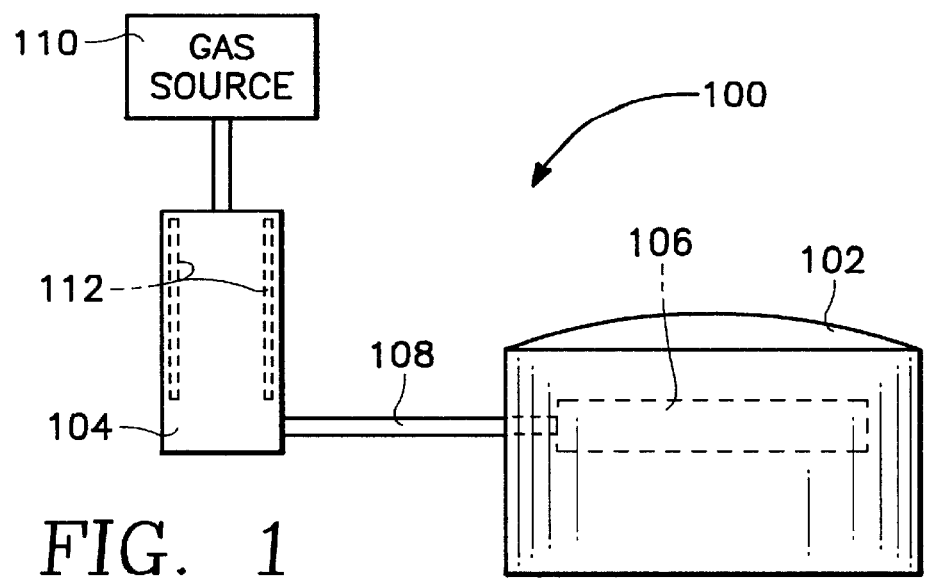
FIG. 1 is a schematic diagram of a plasma reactor incorporating a collateral source chamber in accordance with the present invention.

The Method for Processing a Workpiece of the Present Invention (FIG. 1)

The present invention provides a method for decoupling the control of particle species densities within a plasma. The present invention provides a method for decoupling control of etchant gas neutral and charged particle species, which includes control of the neutral species-to-charged particle species, the neutral specie-to-neutral specie, and the charged specie-to-charged specie densities. The method of the present invention generates a source of plasma collateral to a primary processing chamber 102. The collateral plasma is delivered to the primary processing chamber or primary chamber 102, which contains a workpiece (not shown).

The method of the present invention employs a collateral source chamber 104. The collateral source chamber 104 has at least one radiation applicator or collateral source power applicator 112 for igniting a process gas to form the collateral plasma. The collateral source power applicator 112 can be of the type that uses microwave discharge, inductive discharge, capacitive discharge, E-beam, ultra-violet, or the like. As will be discussed further below, it is presently preferred that collateral power source 112 utilize a helicon wave source, such as a magnetically enhanced inductively coupled power source for collateral power source 112. Essentially any chamber configuration known to be employed for the primary processing chamber of a plasma reactor, however, could be used in constructing the collateral source chamber 112.

The primary chamber 102, used for processing a workpiece, is coupled to the collateral source chamber 104 so as to allow plasma particles generated in the collateral source chamber 104 to flow into the primary processing chamber 102. The primary processing chamber 102, may have a first and second primary chamber power source, not shown in FIG. 1. As discussed further below, it is presently preferred to use a plasma reactor having an inductively coupled plasma source power and a capacitive bias power source as the first and a second primary chamber power sources. Any workpiece processing chamber configuration, however, may be used as primary processing chamber 102. For example, microwave, ultra-violet, E-beam, or the like may be used as a power source for the processing chamber.

A filter 108 may be interposed between the collateral chamber 104 and the primary processing chamber 102. The conduit filter 108 serves to filter the charged particle species entering the primary processing chamber 102. The filter 108 may be selected to provide selective filtering of species. The filter 108 may be selected so as to completely or to selectively block charged particles from entering the primary processing chamber 102. Furthermore, the filter 108 may be selected so as to filter charged particle species with or without regard to mass or velocity.

The filter 108 could be formed in several ways depending on the plasma species densities desired. For example, the filter could employ a re-combination type, an electrostatic, an RF type, a magnetic field type, a combination of the preceding types, or some other type of filtering method or apparatus. The filter types will be discussed further below. Filter 108 selection will depend on the type of process gases used in the collateral and primary chambers 104 and 102, on the type of species generated or introduced in the respective chambers, and on the desired densities of the species used for processing the workpiece within the primary processing chamber 102.

As will be discussed further below, although the collateral or neutral source chamber 104 may generate both neutral and charged particle species, the filter 108 may be selected so that only neutral species are supplied to the primary chamber 102. Although this may be preferred in some embodiments of the present invention, in others, the densities of neutral and charged species supplied to the primary chamber 102 may also be controlled by selecting appropriate collateral source chamber 104 and filter 108 parameters so that primarily neutral species, some neutral and some charged species, primarily charged species, selected charged species, or selected neutral species are supplied to the primary processing chamber 102.

The filtered collateral source plasma is supplied to the primary chamber 102 where it may be used to process the workpiece, or it may be combined with other process gases to produce a processing plasma having the desired species densities. The filter 108 may be employed as an alternative to, or in addition to providing the primary processing chamber 102 with source power to control processing plasma species densities within the primary processing chamber 102.

Figure 3:
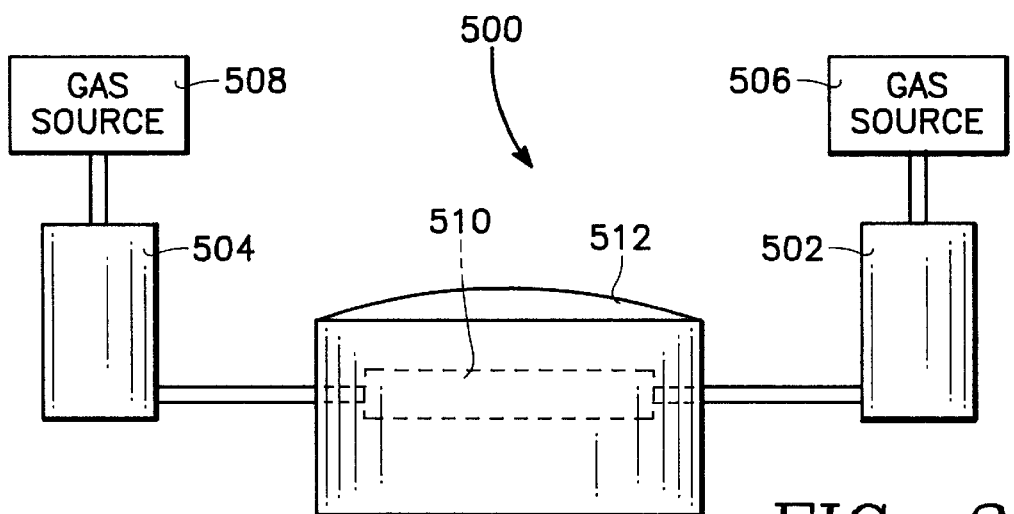
FIG. 3 is a schematic diagram of a plasma reactor incorporating multiple neutral source chambers in accordance with the present invention.

Furthermore, separate control of the neutral and charged particle species densities of the present invention, may be accomplished by employing more than one collateral chamber 104, each providing different species to the processing chamber 102, as depicted in FIG. 3 as 502 and 504, to form the processing plasma.

Figure 9:
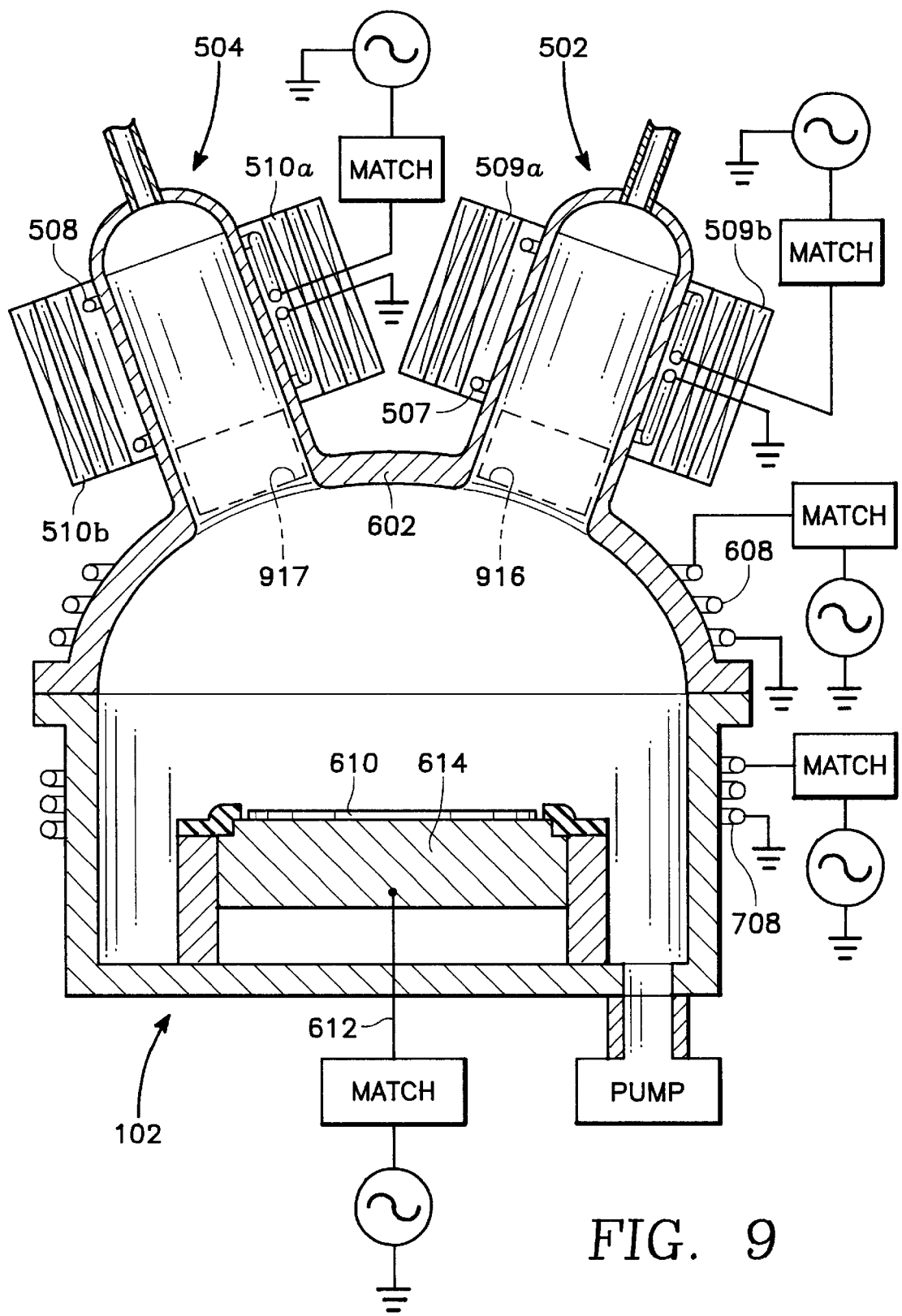
FIG. 9 is a cross-sectional, side view of the plasma reactor of FIG. 3 utilizing magnetically enhanced inductively coupled collateral source chambers and an inductively coupled primary processing chamber.

For example, turning to FIG. 9, one collateral source chamber 502 could produce primarily charged particle species and the other 504 primarily neutral particle species. It is important to note that in this embodiment of the invention, the filter may, or may not, be used with the collateral source chambers 502, 504. Controlling the densities of the plasmas of the collateral source chambers 502, 504, and the combination rates of the plasmas allows control of the relative species densities within the primary processing chamber 102. Interposing the filter between one of the collateral sources 502, 504 and the primary chamber 512 will, however, provide greater control of species densities within the primary processing chamber 512. One chamber could provide primarily charged particle species, or primarily a selected charged particle specie, while the other provides primarily neutral species, as one of may possible ways to control species densities.

A separate source of neutral radicals formed by some other means may also be utilized to control species densities within the processing chamber. For example, thermal dissociation may be used to produce neutral radicals within, or for delivery to, the processing chamber.

The workpiece is exposed to the processing plasma and other process gases in the primary chamber. It is presently preferred to regulate the charged particle energy or ion energy to the workpiece by applying capacitive bias power to the primary chamber, not shown in FIG. 1.

As there are many possible combinations of process gases, generated species, and plasma assisted processes, the method of separately controlling the densities of neutral and charged particle species is not limited by the specific embodiments disclosed below. The following specific examples, illustrate possible embodiments for practicing the method of the present invention. The present invention, however, is in no way intended to be limited to the specific examples or embodiments described below.

Presently Preferred Embodiments of the Present Invention (FIGS. 2A–10)

The present invention provides separate control of plasma species densities so as to optimize process characteristics. The present invention provides for separate control of the density of neutral particle species with respect to all, or selected, charge particle species. It also provides control of the density of a first charged particle specie with respect to a second charged particle specie. Among other factors, the densities of the species in the processing plasma may be determined by collateral plasma species densities, filter selection, and the species densities of primary chamber generated plasma. As there are several types of known plasma reactors, several possible types of particle filters, and several types of workpiece processing techniques, there also are several possible embodiments of the present invention which provide for species density control. FIGS. 1, 3, 4, 6, and 7, for example, provide several non-exclusive variations of the presently preferred embodiment of the present invention. FIGS. 2A–2F provide several non-exclusive variations of the collateral source chamber of the present invention. FIGS. 5A, 5B, and 8A–8D provide several non-exclusive variations of the filter utilized in some embodiments of the present invention.

Turning to FIG. 1, the proposed decoupling of the control of the density of etchant gas or other types of neutral particles in the plasma of the primary processing chamber 102 of plasma reactor 100 from the control of the density of charged particles in the plasma according to the present invention is accomplished by incorporating a collateral source chamber 104 into the reactor, as depicted in FIG. 1. This collateral source chamber 104 is located outside the primary processing chamber 102 of the reactor.

The collateral source chamber 104 has a radiation applicator 112 capable of irradiating the interior of the source chamber and creating a plasma from processing gas flowing therethrough. The applicator 112 can be of the type that uses either a microwave discharge, inductive discharge, or capacitive discharge to irradiate the interior of the collateral source chamber 104 and ignite the plasma. The collateral source chamber 104 is also preferably cooled via any appropriate conventional temperature control device (not shown) to prevent overheating and damage to the chamber when a plasma is ignited therein.

The collateral source chamber 104 is connected at an inlet thereof to a processing gas source 110 that may include etchant gases and at an outlet thereof to a gas distribution device 106 of the primary processing chamber 102.

The etchant or other processing gases that would have been a part of the processing gas heretofore fed directly into the primary processing chamber 102 of the reactor is instead first fed through the collateral source chamber 104. In the embodiment of the present invention depicted here, the remaining constituents of the processing gas are fed into the primary processing chamber 102 in the normal manner.

A plasma is formed within the collateral source chamber 104 from the gas flowing therethrough. The gas breaks-down within the plasma to form, among other things, neutrals and charged particles.

The broken-down gas, of neutral and charged particles formed in the collateral source chamber 104, flows out of the collateral source chamber 104 and into the primary processing chamber 102 where it mixes with the other constituents of the processing gas. This mixing preferably occurs in the manifold of a conventional gas distribution apparatus 106 capable of feeding the combined gases into the primary chamber, although the two gas components could alternatively be fed into the primary chamber 102 via separate gas distribution apparatuses (not shown).

In the embodiment of FIG. 1, the plasma generated in the collateral source chamber 104 is fed into the primary processing chamber 102 via neutral source chamber conduit 108. During transit from the collateral source chamber 104 to the primary processing chamber 102, through the conduit 108, the charged particles generated in the plasma within the collateral source chamber recombine to form neutrals or etchant gas molecules.

The neutral source chamber conduit 108 has a inner diameter and length designed to ensure the neutrals are still substantially intact when reaching the primary processing chamber 102, but substantially all the charged particles are gone. This is possible because the etchant gas neutrals are relatively stable in comparison to the charged particles. If the conduit is too long or has too small an cross-sectional area, however, it is possible for the neutrals to recombine into etchant gas molecules. On the other hand, if the conduit is too short or has too large a cross-sectional area, it is possible for too many of the charged particles to reach the primary processing chamber of the reactor.

It has been found that a tubular-shaped conduit having an inner diameter of approximately 2.5 cm and a length of about 0.5 meters will ensure an almost complete depletion of charged particles from the gases introduced into the primary processing chamber from the neutral source chamber. Of course, other conduit sizing could also be employed with success. The key design criteria, for this embodiment, is that the gases reaching the chamber contain the desired concentration of etchant gas neutrals and the minimum concentration of charged particles possible. Any conduit sizing that will produce these concentrations would be acceptable.

The neutral source chamber conduit 108 is preferably made from a material or is lined with a material that is resistant to attack by the process gas neutrals and charged particles flowing through it. For example, in the case where the process gas includes the etchant gas chlorine that produces Cl neutrals, the conduit could be made of or lined with Teflon for protection.

By employing a properly sized neutral source conduit, the gases entering the primary chamber 102 from the collateral source chamber 104 will for the most part comprise etchant gas neutrals with some amount of etchant gas molecules. It is noted that the flow rate of the gases from the collateral source chamber 104 to the primary processing chamber 102 is practically irrelevant because it has been found the charged particles almost completely recombine regardless of how fast the gases are moving though the conduit—at least at flow rates consistent with plasma assisted etch processing.

Figure 2A:
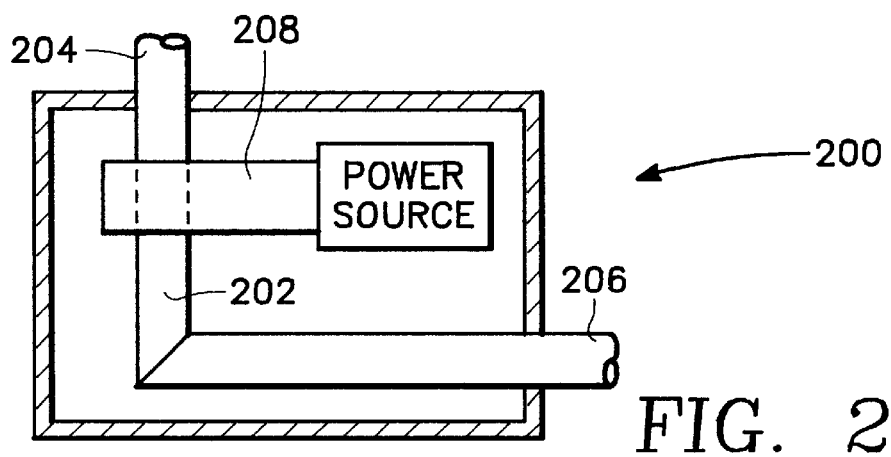
FIG. 2A is a partially cross-sectional, side view of the collateral source chamber of FIG. 1 employing a microwave power applicator.

FIG. 2A illustrates an embodiment of a collateral source chamber 200 configured to create a plasma using a microwave discharge. In this embodiment, the source chamber 200 includes an applicator tube 202, preferably made of a dielectric material such as sapphire. The applicator tube 202 is connected at one end to a gas source (not shown) via an appropriate inlet feed line 204, and at the other end to the inlet of the neutral source chamber conduit 206, which is in turn connected to an inlet of the primary processing chamber of the plasma reactor. The applicator tube 202 passes through a microwave source 208 at a point in-between the inlet feed line 204 and the conduit 206. The microwave source 208 creates a plasma inside the applicator tube 202 from the gas passing through on its way to the primary processing chamber.

Figure 2B:
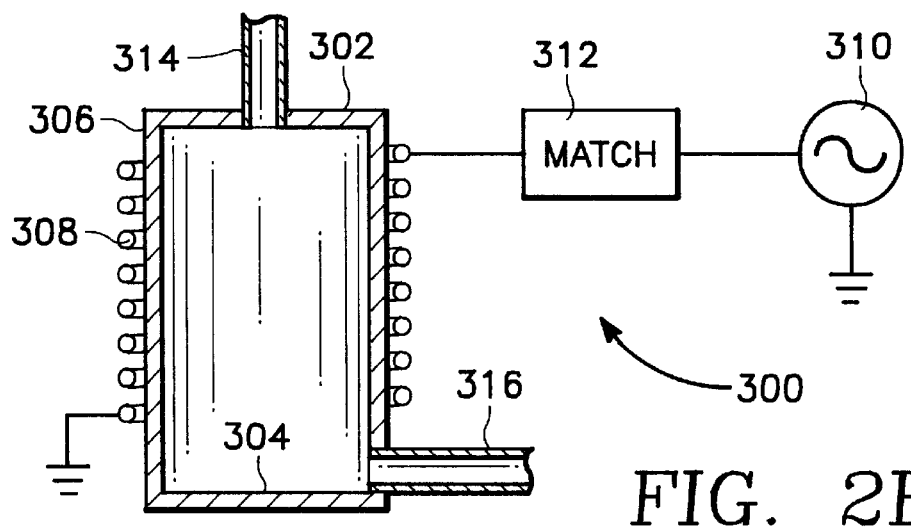
FIG. 2B is a cross-sectional, side view of the collateral source chamber of FIG. 1 employing an inductive coil power applicator.

FIG. 2B illustrates an embodiment of a collateral source chamber 300 configured to create a plasma using an inductive discharge. The chamber 300 has disk-shaped top 302 and bottom 304, and a cylindrical side wall 306. An inductive coil antenna 308 is wound around the side wall of the chamber 300 and connected to a radio frequency (RF) plasma source power generator 310 through an impedance match circuit 312 to provide RF power into the chamber. Preferably, the side wall 306 is made of a dielectric or semi-conductor material so as to not significantly inhibit the transfer of RF energy into the chamber. Processing gas is introduced into the collateral source chamber 300 via an inlet line 314 that originates at a conventional gas source (not shown). The processing gas is broken-down inside the chamber 300 and exits via the neutral source chamber conduit 316. The conduit 316 is connected to an inlet of the primary processing chamber, as described previously.

The above-described chamber structure is meant as an example only. Many other chamber shapes are equally viable. For example, the collateral source chamber could have a domed-shaped top portion similar to the primary processing chambers of many commercially available plasma reactors. (FIGS. 2D, 4, 6, and 7, discussed below, illustrate an embodiment of the collateral source chamber having a dome shaped top portion.) The coil antenna in such a dome shaped reactor could surround all or a portion of the dome shaped top section.

Essentially, any chamber configuration known to be employed for the primary processing chamber of a plasma reactor could also be used in constructing the collateral source chamber associated with the present invention.

Figure 2C:
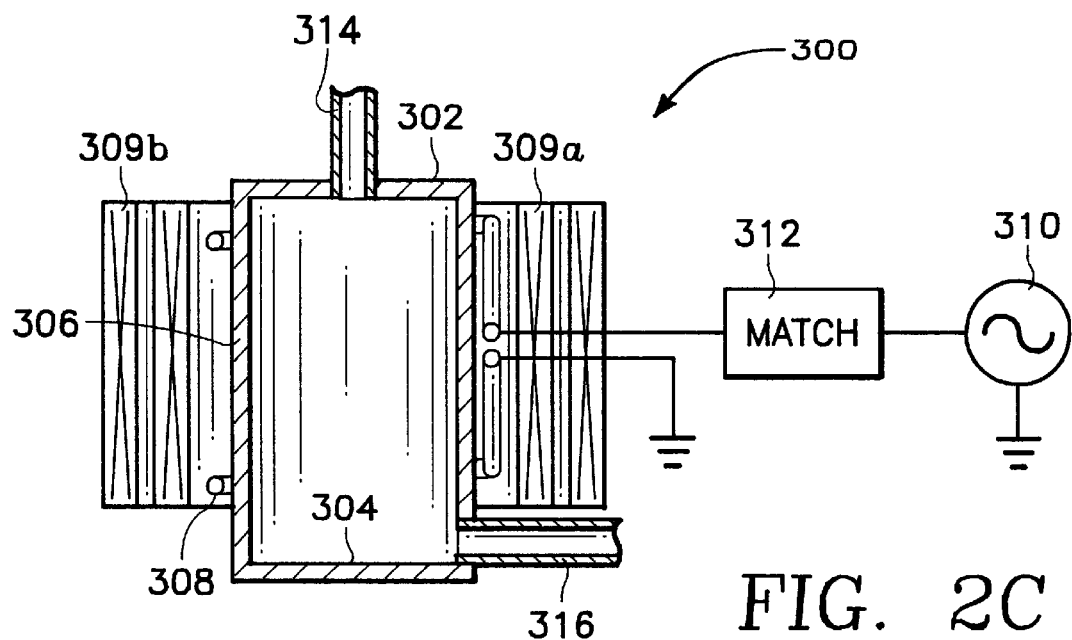
FIG. 2C is a cross-sectional, side view of the collateral source chamber of FIG. 1 employing an magnetically enhanced inductive power applicator.

FIG. 2C illustrates another embodiment of a collateral source chamber 300 configured to create a plasma using an inductive discharge to create a helicon wave. The embodiment of FIG. 2C has an inductive antenna 308 looped around the chamber wall 306 near the top portion 302 and near the bottom portion 304. The antenna is designed so that the RF currents in the two loops is 180 degrees out of phase so as to propagate the helicon wave. Inner and outer electromagnets 309A and 309B are located circumferentially around the wall 306 outside the antenna 308. The electromagnets 309A and 309B serve to enhance inductive plasma generation in the collateral chamber 300.

Figure 2D:
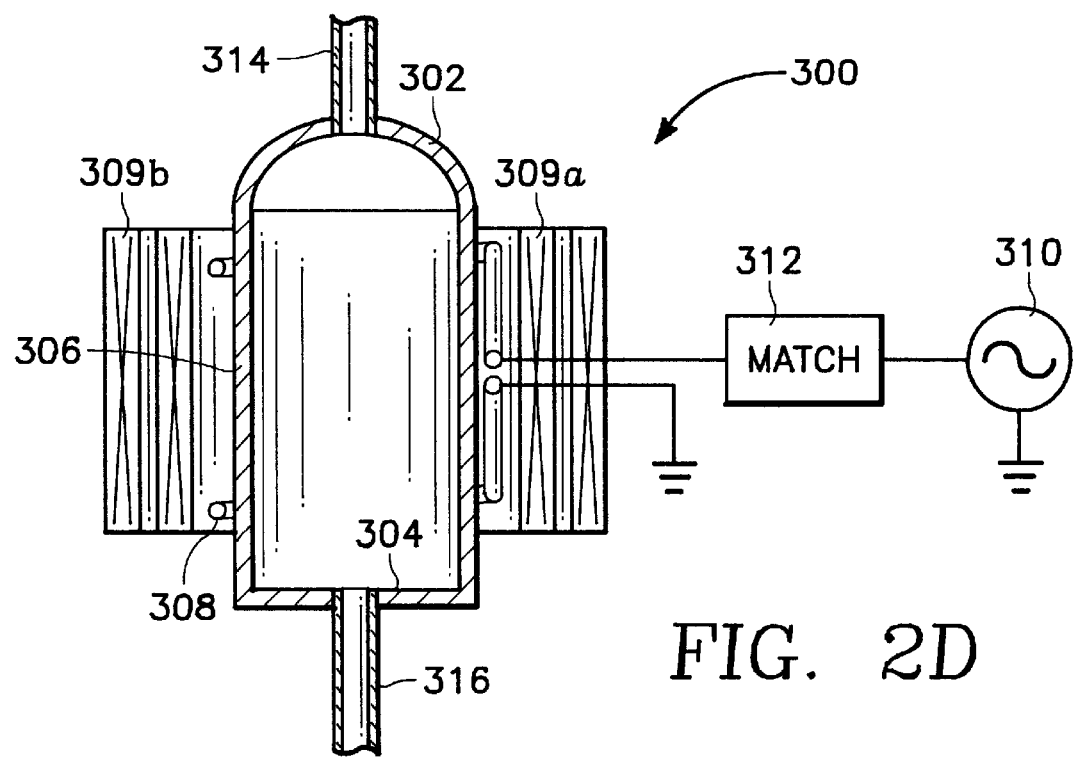
FIG. 2D is a cross-sectional, side view of the collateral source chamber of FIG. 1 having a dome shaped top and employing an magnetically enhanced inductive power applicator.

FIG. 2D illustrates another embodiment of inductively coupled collateral source chamber 300. In the embodiment of FIG. 2D the top portion 302 is dome shaped. As in FIG. 2C, the inductive antenna 308 is looped around the chamber wall 306 near the top portion 302 and near the bottom portion 304 and is designed so RF currents in the two loops is 180 degrees out of phase so as to propagate the helicon wave. The inner and outer electromagnets 309A and 309B are located circumferentially around the wall 306 of collateral chamber 300, outside of the inductive antenna to enhance inductive plasma generation. This embodiment of the collateral source chamber 300 is commonly referred to as a magnetically enhanced inductively coupled plasma reactor or MEICP reactor. It is preferred to operate this type reactor with an m=0 helicon wave.

In the embodiment of FIG. 2D, the inlet line 314 is shown attached to the dome shaped top 302 and the conduit 316 is shown extending from bottom portion 304 of the chamber 300. The conduit 316 may be connected to an inlet of the primary processing chamber, as described previously. This configuration provides a more laminar flow of the process gas and plasma through the collateral chamber 300, and allows plasma to more easily be directly fed into the primary processing chamber 102 in certain embodiments.

Figure 2E:
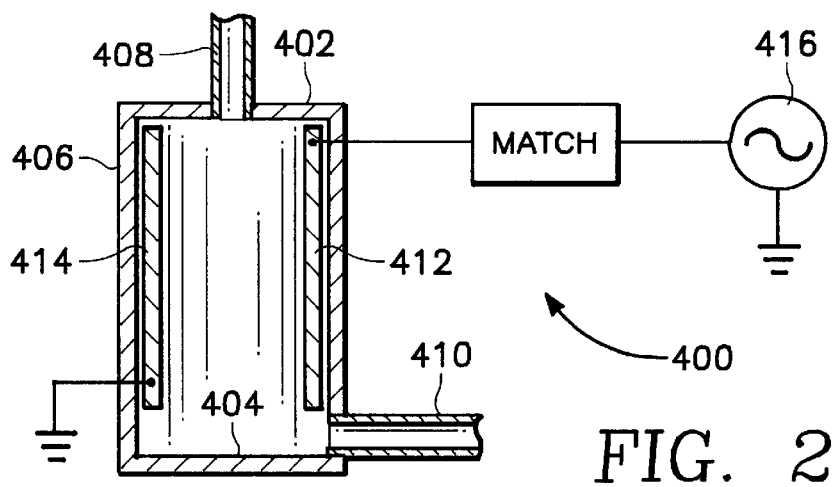
FIG. 2E is a cross-sectional, side view of the collateral source chamber of FIG. 1 employing a capacitive power applicator comprising a pair of oppositely facing internal electrodes.
Figure 2F:
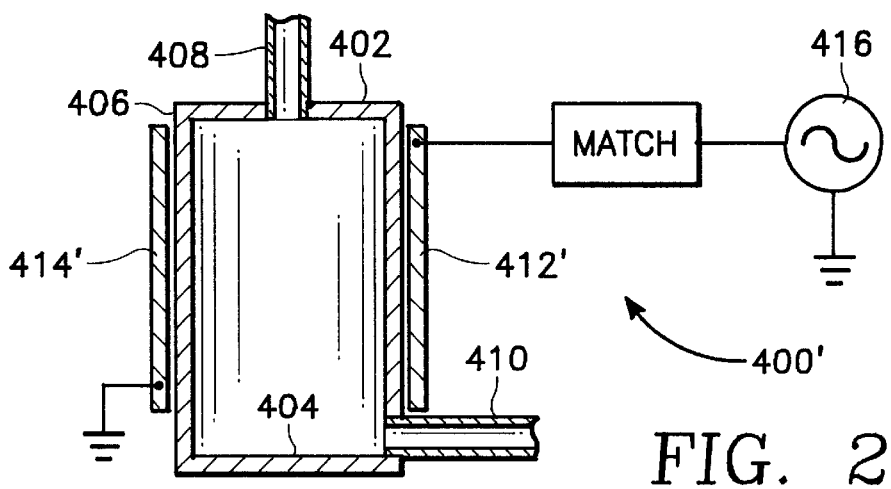
FIG. 2F is a side view of the collateral source chamber of FIG. 1 employing a capacitive power applicator comprising a pair of oppositely facing external electrodes.

FIGS. 2E and 2F illustrate an embodiment of a collateral source chamber 400 configured to create a plasma using a capacitive discharge. The external parts of the chamber 400 are similar to those of the chamber of FIG. 2B and 2C in that there is a disk-shaped top 402 and bottom 404, and a cylindrical side wall 406. Processing gas is introduced into the collateral source chamber 400 via an inlet line 408 that originates at a conventional gas source (not shown). The gas once broken-down in the chamber 400 exits via the aforementioned collateral source chamber conduit 410, which is connected to an inlet of the primary processing chamber.

The chamber 400 differs from the previously-described inductive discharge embodiment in that the inductive coil antenna is replaced by a pair of electrodes 412, 414. In a first version of the capacitive discharge embodiment shown in FIG. 2E, these electrodes 412, 414 are resident within the chamber 400 and face each other from opposite sides so as to form a plasma formation region therebetween. The electrodes 412, 414 are electrically connected to opposite sides of a plasma source power generator 416. Since the electrodes 412, 414 are resident within the chamber 400, the lid 402, bottom 404 and side wall 406 can be made of any appropriate material including a dielectric or semiconductor material, or a metal such as aluminum or stainless steel.

In an alternative version of the capacitive discharge embodiment shown in FIG. 2F, the electrodes 412', 414' are placed outside the side wall 406 of the chamber 400' on opposite sides thereof so as to face each other and form a plasma formation region inside the chamber. The electrodes 412', 414' are connected to the plasma source power generator 416 in the same way as the previous version of this embodiment shown in FIG. 2E. Because the electrodes 412', 414' are outside the side wall 406 of the chamber, however, the side wall is made of a dielectric or semi-conductor material so as to not significantly inhibit the transfer of RF energy into the chamber.

FIGS. 2A–2F provide examples of the collateral chamber of the present invention. Other shapes, or power sources may be utilized for the collateral chamber of the present invention. For example, power sources such as ultra-violet, E-beam, or the like could be utilized. As discussed above, essentially any chamber configuration known to be employed to the primary processing chamber of a plasma reactor could also be used in constructing the collateral source chamber associated with the present invention.

Figure 4:
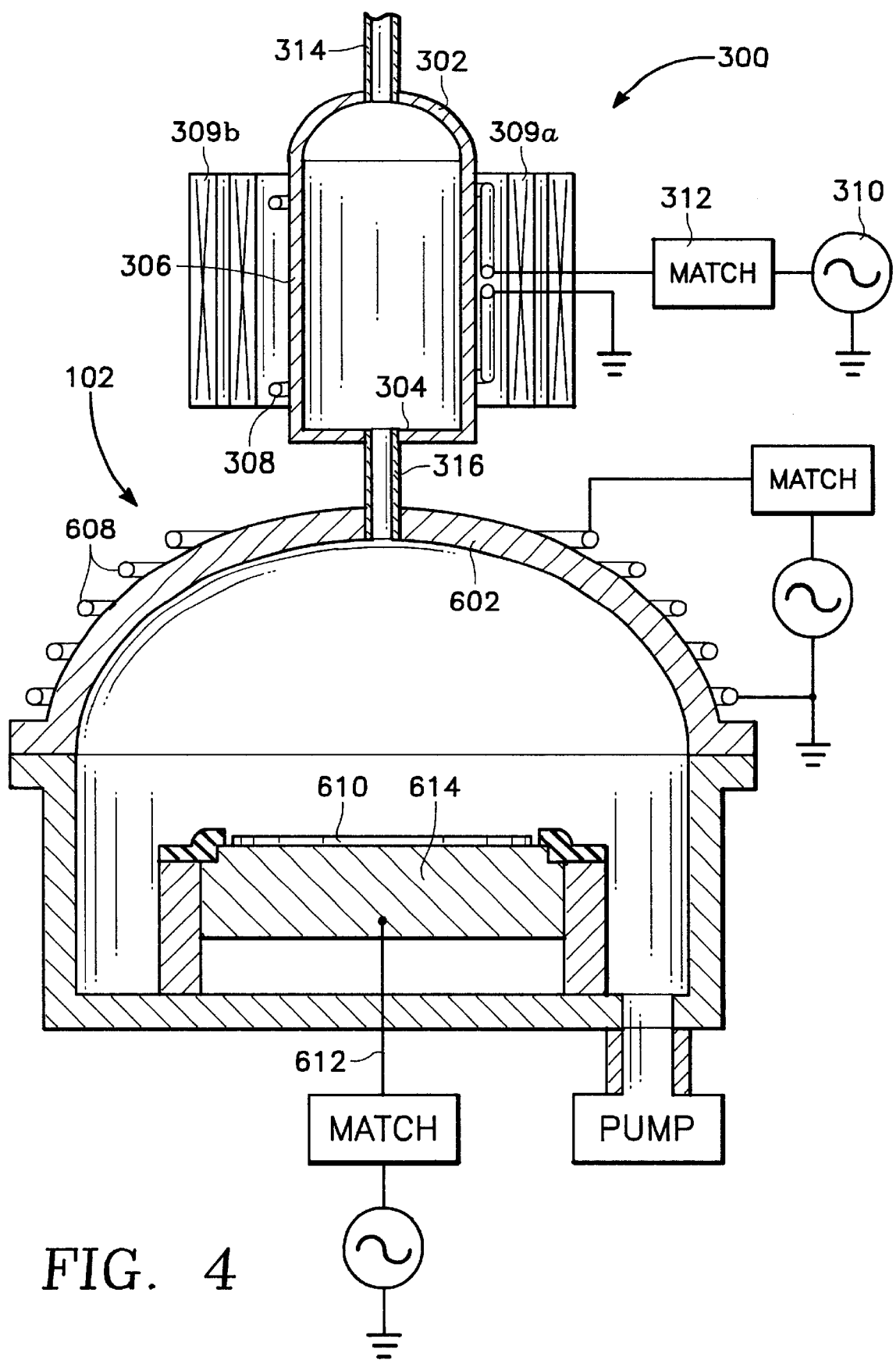
FIG. 4 is a cross-sectional, side view of the plasma reactor incorporating a collateral source chamber of FIG. 1 utilizing an inductively coupled primary processing chamber and the magnetically enhanced inductively coupled collateral.

Turning to FIG. 4, the collateral source chamber 300 of the present invention, shown in FIG. 2D, is attached via conduit 316 to a primary processing chamber 102 having an inductive coil antenna located over a dome shaped top portion. The dome shaped top portion 602 of primary processing chamber 102 allows the filtered collateral plasma to be delivered near a source power applicator 608 of the primary processing chamber 102. A source power applicator 608 may be utilized to generate or sustain a primary chamber plasma, not shown, in the primary processing chamber 102 from the collateral source chamber supplied plasma or other process gases (not shown) introduced into the primary processing chamber 102. The source power applicator 608 may be an inductive antenna as shown in FIG. 4, or some other type source power applicator, such as microwave, ultraviolet, E-beam, or the like, capable of generating plasma. A capacitive bias 612 may be applied to workpiece 610 via pedestal 614 to control charged particle energy flux to the workpiece 610. In this way, plasma density, charged particle energy, and species densities may be independently controlled.

In these embodiments, the addition of a collateral source chamber and conduit to the plasma reactor has the effect of decoupling the control of the density of the etchant gas neutrals from the control of the density of the charged particles. The collateral source chamber and conduit can be used to introduce a sufficient amount of etchant gas neutrals into the primary processing chamber so as to create the desired density therein. This would be accomplished by setting a controlling group of collateral source chamber parameters, i.e. the power input level, the processing gas flow rate and the chamber pressure, to levels that would result in the desired amount of etchant gas neutrals being produced and then feeding the neutrals into the primary chamber. Simultaneously, the same controlling parameters associated with the primary processing chamber would be set so as to produce the desired density of charged particles therein. Thus, in effect the density of etchant gas neutrals is determined by controlling the aforementioned parameters associated with the collateral source chamber, whereas the density of charged particles is determined by controlling similar parameters associated with the primary processing chamber.

Of course, the plasma ignited within the primary processing chamber may produce some amount of etchant gas neutrals in addition to those supplied from the source chamber, either from "raw" etchant gas introduced into the primary chamber along with other processing gases or from the etchant gas molecules that reach the primary chamber from the collateral source chamber. These additional etchant gas neutrals would be taken into account when setting the controlling parameters associated with the source chamber, so that the combined amounts of etchant gas neutrals approximately equals the overall desired density within the primary processing chamber.

Given the above-described reactor and processing methods, it would be possible to vary the constituents of the plasma formed within the primary processing chamber anywhere between a neutral rich mix and an ion rich mix.

A neutral rich plasma within the primary processing chamber can be created by setting the controlling parameters of primary chamber relatively low. At low levels, very little ionization of the processing gases introduced into the primary chamber would occur. Therefore, the density of charged particles in the plasma would be very low. Of course very little dissociation would occur as well. The etchant gas neutral previously provided by this dissociation in the primary chamber, however, now would be supplied from the collateral source chamber. The net result is a plasma very rich in neutrals, but with a very low density of charged particles. Such a neutral rich plasma can be advantageously used in many etch processes. For example, isotropic etch processes requiring an extremely high degree of etch selectivity can be achieved using a neutral rich plasma.

An ion or charged particle rich plasma within the primary processing chamber can be created by introducing little or no etchant gases into the primary processing chamber. Instead other processing gases would be used to form the plasma. These other gases would be of the type that produce charged particles, but non-reactive neutrals. For example, argon would be such a processing gas. The levels of the controlling primary processing chamber parameters would be sufficient to ionize the processing gases and produce the desired density of charged particles in the plasma. The desired density of etchant gas neutrals, which in this case would be relatively low, would be supplied to the primary chamber from the collateral source chamber. The controlling parameters associated with the source chamber would be set to ensure the desired low quantity of etchant gas neutrals are supplied to the primary chamber. The net result is a plasma very rich in ions, but with a very low density of etchant gas neutrals. Such an ion rich plasma can be advantageously used in etch processes where dielectric materials such as $SiO_2$, SiN, or un-doped silicon are to be etched from the workpiece.

Varying the controlling parameters of the primary and source chambers and varying the amount and type of processing and etchant gases supplied to each chamber from those described above will allow for practically any combination of etchant gas neutral and charged particle densities to be created into the plasma of the primary chamber.

The addition of the collateral source chamber to the plasma reactor also provides processing versatility beyond the general decoupling of the control of the densities of the etchant gas neutrals and charged particles described above. For example, the previously described passivation process employed during silicon etching wherein oxygen or nitrogen is introduced into the primary processing chamber to form neutrals that react with silicon and produce etch-resistant deposits on particular surfaces of the workpiece, can be improved using the collateral source chamber associated with the plasma reactor embodying the present invention. In etch processes where the density of charged particles in the plasma of the primary chamber are preferably kept to a minimum, the introduction of oxygen or nitrogen into the primary chamber would be counterproductive as a portion of these gases will ionize if, for example, the power input level is high enough. To prevent the formation of detrimental charged particles from the oxygen or nitrogen, these gases could be introduced into the collateral source chamber instead. In this way, the oxygen or nitrogen gas would breakdown to form neutrals and charged particles in the source chamber. The oxygen or nitrogen neutrals would then be fed into the primary processing chamber of the reactor where they would react to form the desired etch-resistant deposits. The oxygen or nitrogen ions, however, would be recombined during transit through the neutral source conduit and would not reach the primary processing chamber where they could detrimentally affect the etch process. This improved passivation method can occur simultaneously with the production of etchant gas neutrals within the neutral source chamber, if desired.

The example of an improved passivation process was described above is not exclusive. It should be evident to one skilled in the art in view of this description that any processing gas could be dissociated in the collateral source chamber and supplied to the primary processing chamber without the concomitant addition of charged particles to the primary chamber plasma. Thus, in essence, the density of any processing gas neutrals can be separately controlled from the density of the charged particles associated that gas using the collateral source chamber.

In regards to the aforementioned suggestion that etchant gases and other processing gases could be simultaneously introduced into the collateral source chamber and broken down together prior to being fed into the primary chamber of the reactor, it should be noted that this may present problems in some cases. For example, the controlling parameter levels required to produce a desired etchant gas neutral density in the primary processing chamber may not also produce the desired density of the other processing gas neutrals.

In such a case, two or more collateral source chambers can be incorporated into the plasma reactor. In this configuration, the individual collateral source chambers are connected separately to the gas distribution apparatus 510 of the primary processing chamber 512 of the reactor 500, such as the two chamber 502, 504 depicted in FIG. 3.

Each chamber is also connected to a separate gas source 506, 508. The collateral source chambers would be fed with the gas or gases that a user wishes to separately control the neutral density of in the primary chamber. Thus, in the example given above, the etchant gases would be fed through the first collateral source chamber 502 and the oxygen or nitrogen would be fed through the second source chamber 504. The controlling parameters respectively associated with the two source chambers 502, 504 would be set to levels that will produce the desired neutral density for the particular gases flowing through that chamber.

Thus, if two such types of gases are of interest, two collateral source chambers are employed. If it is desired to control the neutral density of three such gases, three collateral source chambers are employed, and so on.

Figure 5A:
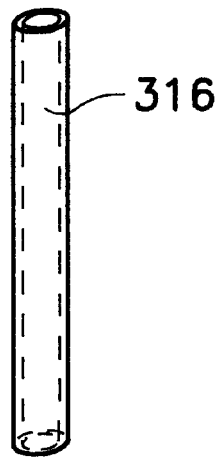
FIG. 5A is a cross-sectional, side view of the conduit recombination filter of FIG. 1.
Figure 5B:
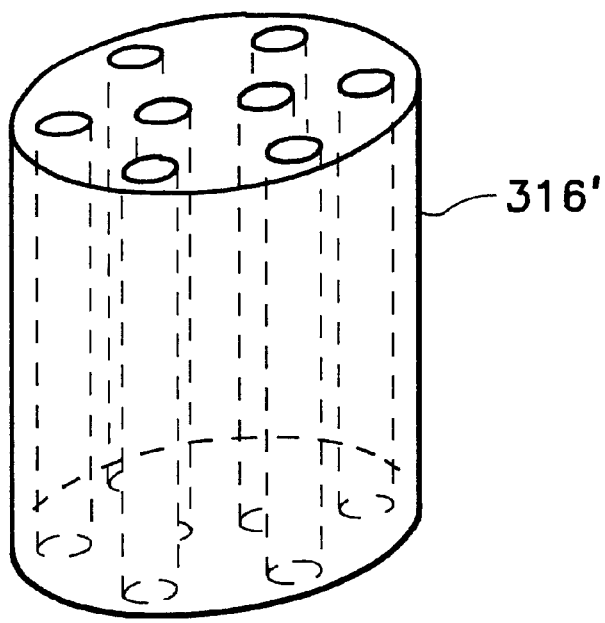
FIG. 5B is a cross-sectional, side view of multiple conduit recombination filter of FIG. 5A.

Turning to FIG. 5A, as discussed above, the conduit filter 316 may have varying dimensions to produce the desired level of charged particle filtering. It is also possible to use other embodiments of the filter 316 of the present invention. It is possible to use several conduits 316 in parallel, as depicted in FIG. 5B, to filter charged particles. Therefore, the conduit filter 316 may be combined with other conduits 316 to produce filter 316' comprised of multiple conduits 316.

Figure 6:
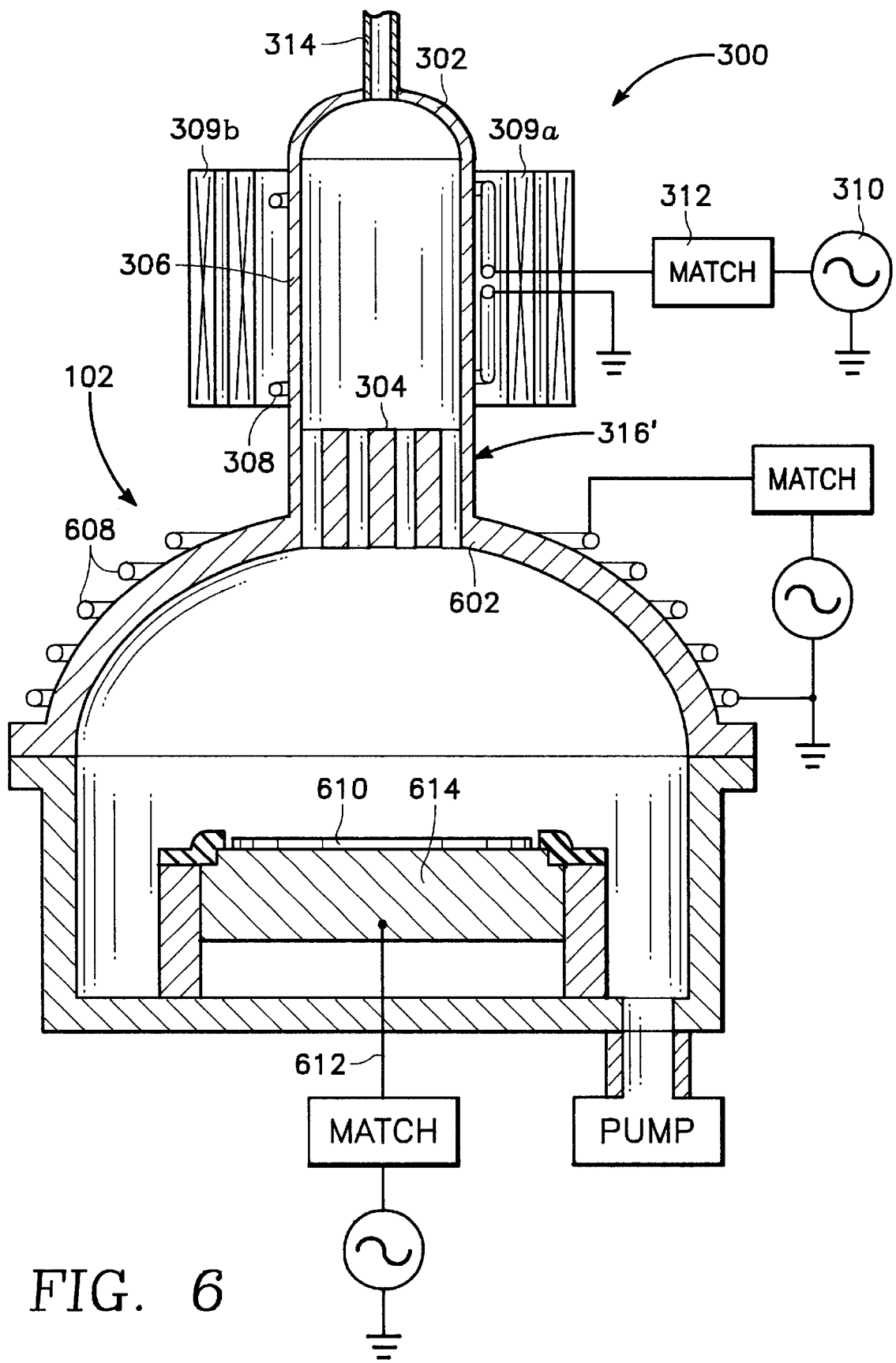
FIG. 6 is a cross-sectional, side view of the plasma reactor of FIG. 4 having utilizing the multiple conduit recombination filter of FIG. 5B.

FIG. 6 depicts the multiple conduit filter 316' interposed between the inductively coupled magnetically enhanced collateral source chamber 300 and the inductively coupled primary processing chamber 102. The filter 316' comprised of multiple conduits 316 may be employed to remove all charged particles from the collateral plasma generated in collateral source chamber 300. Charged particle species may then be generated in the primary processing chamber 102 or generated by a second collateral source chamber, as shown in FIG. 5, which is coupled to the primary chamber 102 without the conduit filter 316, or the multiple conduit filter 316', or other recombination type filter.

With the present invention, it is also possible to filter charged particles using other embodiments of the recombination type filters of 316 and 316'. For example, a grounded neutralizing grid 316a, shown in FIG. 7A, could be employed to filter charged particle species from the collateral source plasma prior to delivery into the primary processing chamber. The neutralizing grid has openings 702 which allow the neutral species of the collateral plasma to pass while filtering charged particle species.

Turning to FIG. 7B, as an alternative to grounding the neutralizing grid filter 316a of FIG. 7A, a voltage source 710 could be applied to the grid filter 316b, shown in FIG. 7B, to provide selective recombination of either positively or negatively charged particle species. For example, the recombination grid 316b could be negatively charged so that positively charge species either would be removed from the collateral plasma or neutralized with electrons. In this way, the charged particles in the collateral plasma could be filtered in accordance with their charge prior to delivery into the primary processing chamber.

It is also possible to form the grid type filter of a dielectric type material to filter species. Such a filter could filter species through surface recombination. In addition to the embodiments shown in FIGS. 7A & 7B, the geometry of the filter could be manipulated to increase this effect. In such a case, the grid type filter could be installed without a set voltage potential. In addition to changing species concentrations in the processing chamber, this type of filter may also be used prevent deposition elements from flowing into the collateral source chamber.

Another possible filter apparatus is an electric field filter. Such a filter could be used to filter charged particles according to charge and mass. For example, an electro-static field could be established utilizing plates or poles interposed, either externally or internally, between the collateral source chamber and the primary chamber. This would allow charged particle species generated in the collateral chamber to be diverted from entering the primary processing chamber. An RF electric field filter could also be utilized to filter charged particle species according to charge and mass. The RF field filter could be established similar to the electro-static filter by utilizing plates or poles interposed, either externally or internally, between the collateral source chamber and the primary chamber. In this way, charged particle species in the collateral plasma could be filtered with regard to charge or with regard to charge and mass prior to delivery into the primary processing chamber.

Turning to FIG. 7C, a quadrupole filter apparatus 316c is an example of the electric field filter which could be employed to filter charged particles from the collateral plasma prior to delivery to the primary processing chamber. The quadrupole filter 316c, similar to the type used in mass spectrometers, may be interposed between the collateral source chamber and the primary processing chamber. The quadrupole filter 316c may be used to divert charged particle species according to their mass.

The electric field filter of FIG. 7C could produce electrostatic fields, RF fields, or a combination thereof. With the quadrupole filter 326c, charged particle species are separated by applying electric potential to rods 750a, 750b, 750c, and 750d to establish electrostatic and RF electric fields, not shown. Proper DC biases and current phases are selected so that the strength and phase of the fields within the rods 750a, 750b, 750c, and 750d, will divert selected charged particles passing through according to mass and charge.

Typically four rods 750*a*, 750*b*, 750*c*, and 750*d* are used, although plates or some other form, or other type, of conductor may be used. Furthermore, although the quadrupole of FIG. 7C has four poles, the electric field filter of the present invention is not limited to four poles. Any amount of poles may be utilized to produce the electric field filter of the present invention.

The electric field filter 316*c* of FIG. 7C may be employed to filter selected, or all, charged particle species. In other words, the filter 316*c* may be utilized to adjust the density of one charged particle specie with respect to another charged particle specie.

Filtering one charged particle specie may be used to improve workpiece processing. For example, in a metal etch process, it is thought that the ratio of $Cl^+$ to $Cl_2^+$ may reduce metal residue in the primary processing chamber. The magnitude of the fields may be selected so that some, or so that all, of $Cl_2^+$ specie are filtered from the collateral plasma while all of the $Cl^+$ specie are allowed to pass to the primary chamber. Selective filtering of charged particle species will allow for greater control of species densities within the primary processing plasma.

Turning to FIG. 7D, the present invention may utilize a magnetic field filter 316*d* for filtering the collateral plasma. The magnetic field filter 316*d* may be interposed between the collateral source chamber and the primary processing chamber and serves to deflect charged particle species. A permanent magnet or an electromagnet 770 generates a magnetic field 316*d* having lines of force 772 orthogonal to the path of the collateral plasma as it flows toward the primary processing chamber. The magnetic field filter will generate a force F, that acts upon charged particles according to the equation:

$$F=q(v \times B)$$

This force can be utilized to deflect all charged particles traveling toward the primary chamber, back toward the collateral chamber, thereby preventing charged particles from entering the primary processing chamber.

The magnetic filter could also be employed to selectively filter charged particle species by charge-to-mass ratio, so as to select a particular species. As more massive charged particle species would have greater momentum within the plasma flow, by properly adjusting the strength of the magnetic field, charged particle species could be selectively filtered by charge-to-mass ratio. For example, a lesser magnitude magnetic field would be required to deflect massive molecular charged species back to the collateral source chamber than would be required to deflect the less massive electrons. The magnitude of the magnetic field could be selected so that it diverts only the more massive species, such as molecular charged species, while allowing less massive species, such as the electrons to pass to the primary source chamber. Although charged molecular species and electrons are described for illustration purposes, the magnetic filter could be used to selectively filter charged molecular species. In this way, the magnetic filter 316*d* may selectively filter charged particles by charge-to-mass ratio so that the density of one charged specie may be adjusted with respect to another, or several other, charged specie.

Although only a single static magnetic field is depicted in FIG. 7D, other embodiments of the filter of the present invention may employ several fields or may utilize time-varying magnetic fields.

The different filter types discussed above may be combined to provide further filtering of collateral plasma prior to entry into the primary processing chamber. Any of the filter types could be combined to produce the desired species densities within the primary plasma. For example, the quadrupole of FIG. 7C could be combined in series with the conduit of FIG. 5A or 5B in a single collateral source chamber. The quadrupole could be employed to allow certain selected charged specie to pass through to the conduit filter. The conduit filter would then allow recombination of the selected charged specie, thereby producing a selected neutral species. In this way, the present invention may be employed to supply a selected neutral species, such as a neutral radical, to the primary chamber to adjust that specie's density. Charged particle species may be delivered to the chamber by another collateral chamber or generated in the primary processing chamber using primary chamber source power.

The preceding illustration is for example purposes, other combinations of filters and filter types, such as any electric field type, magnetic field or electromagnetic field type with a recombination type, any electric field with any magnetic field type, multiple filters of the same type, etc., may be employed to control the species density within the primary processing chamber.

Figure 8:
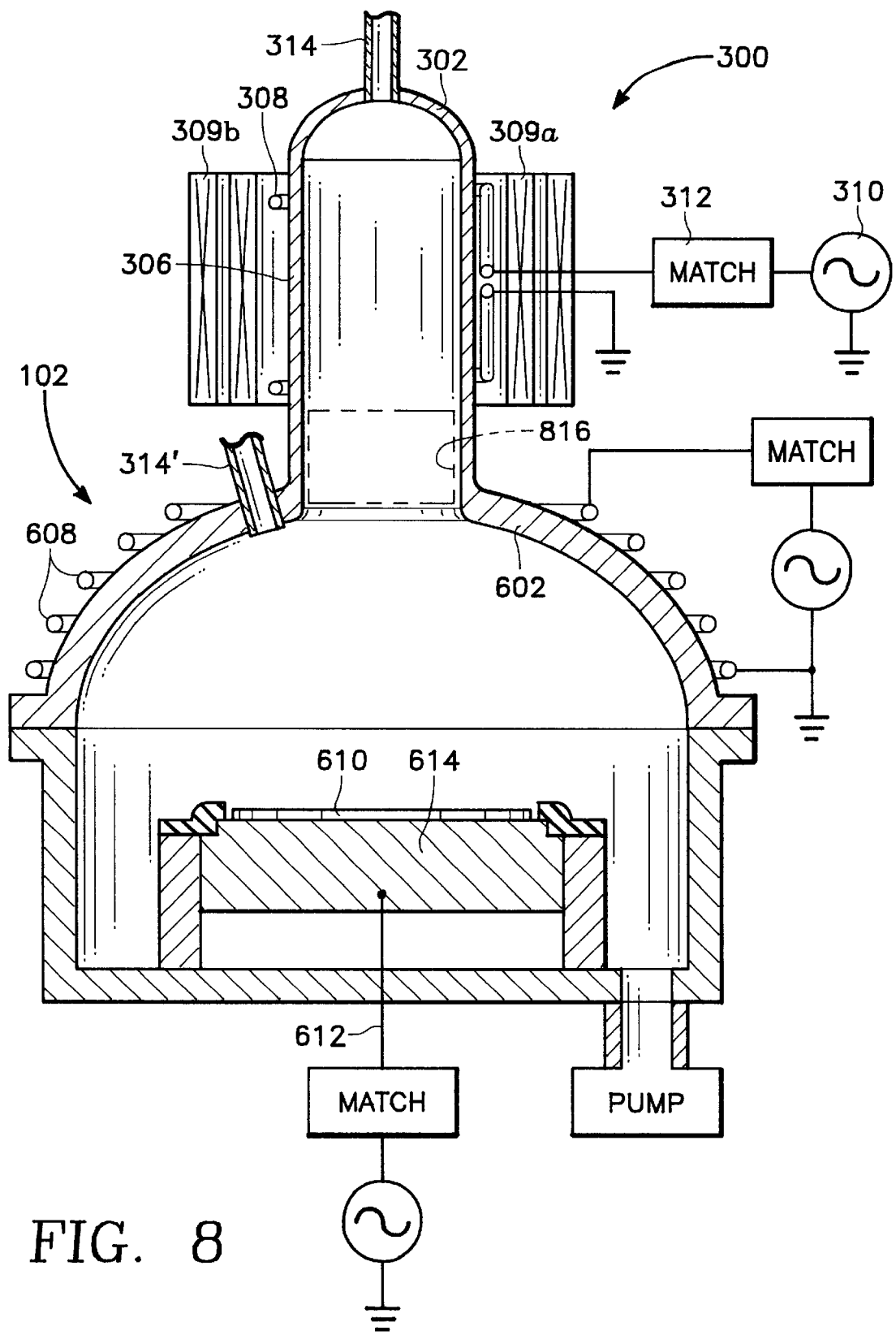
FIG. 8 is a cross-sectional, side view of the plasma reactor of FIG. 1 utilizing a magnetically enhanced inductively coupled collateral source chamber and an inductively coupled primary processing chamber and depicting possible filter placement.

Turning to FIG. 8, as discussed above, the present invention is not limited to neutral species generation in the collateral chamber 300. The collateral chamber 300 may produce both neutral and charged species. Or, the primary chamber may be employed to produce primarily charged species. The species produced in the collateral chamber 300 may be filtered and supplied to the primary processing chamber 102 to control species density in the primary processing chamber. In addition, multiple collateral source chambers, illustrated in FIG. 3, or the primary processing chamber itself, may add to the species of particles within the processing chamber.

As discussed above, in addition to providing neutral particles to the processing chamber by interposing a filter, or filters at 816, the present invention may be employed to selectively filter charged particles. In certain applications, the collateral chamber 300, or one of several collateral chambers, may be required to supply primarily charged particles to the processing chamber 102. In such a case, the input parameters of the collateral chamber 300, such as source power, temperature, and pressure would be selected so that the collateral source chamber produces primarily charged particle species.

The collateral plasma comprising primarily charged particle species could then be filtered by interposing the appropriate filter, or filters at 816, as discussed above, or not filtered at all, so as to provide the desired charged particle species density to the primary processing chamber 102. As an alternative, or in addition to filtering, the primary processing chamber 102, or another collateral source chamber, as depicted in FIGS. 3 & 9, could be employed to produce, or supply, the desired neutral species.

The collateral source chamber 300 may be embodied as an magnetically enhanced inductively coupled reactor, as depicted in FIG. 8, when the collateral chamber is selected to provide charged particle species to the primary processing chamber. The MEICP has the benefit being capable of producing ionization rates approaching 100%. Such a charged particle rich plasma could then be directly supplied to the primary processing chamber as a source of charged particle species.

Or, the collateral plasma generated by such a collateral source chamber may be selectively filtered prior to delivery to the primary processing chamber 102 so that it comprises primarily one specie of charged particle. As another option, the collateral plasma comprising primarily charged particles could be filtered, using multiple filters as discussed above, so that the selected charged specie is recombined to produce primarily one specie of neutral particle for delivery to the primary processing chamber 102.

Although the advantages of the MEICP reactor may be beneficial in some processes, any embodiment of the of collateral source chamber may be employed to produce varying densities of charged particle species which may be supplied, filtered or unfiltered, to the primary processing chamber to separately control species densities within the primary processing chamber. The present invention is intended to be applied to all types of plasma, or plasma assisted, reactors.

FIG. 8 shows an process gas inlet line 314' in the primary chamber 102. The process gas inlet line 314' may deliver process gas to the primary chamber 102. The process gas may be ignited by the inductive antenna 608 to form a plasma in the primary chamber. The collateral chamber 300 generated plasma is introduced into the primary chamber 102 to combine with the ignited process gas to form a processing plasma in the primary chamber 102.

Although the embodiment of FIG. 8 is illustrated having a dome shaped ceiling 602, the inductive antenna 608, and the capacitive bias 612 supplied to the workpiece 610 via the pedestal 614, the present invention is not limited to this embodiment. The present invention is intended to be applied to all types of plasma, or plasma assisted, reactors. In addition, the embodiment of FIG. 8, along with other embodiments of the present invention, may, or may not supply source power to the primary processing chamber 102 in order to provide species density control. Likewise, embodiments of the present invention may, or may not employ a filter to provide species density control within the processing chamber 102. Furthermore, several collateral chambers and process gas sources may be employed to control species densities and workpiece processing. Process gas, therefore, may be supplied to both the collateral source chamber 300 and the primary chamber 102, only to the primary chamber 102, only to the collateral source chamber 300, or only to multiple collateral source chambers. Each of the multiple collateral chambers may employ different types of filters, or none at all, to produce the desired primary processing chamber plasma.

Turning to FIG. 9, the present invention may employ more than one collateral chamber to control the species densities within the primary processing chamber 102. FIG. 9 shows two collateral source chambers 502, 504. Each collateral source chamber 502, 504 may produce a different species so that the combination of the two plasmas created by collateral source chambers 502, 504 produces the desired species densities within the primary processing chamber 102.

With the embodiment of FIG. 9, as with other embodiments discussed herein, the primary processing chamber 102 may, or may not, have source power. The primary processing chamber 102 of FIG. 9 has inductive coil antennas 608 and 708 disposed around the primary processing chamber 102. By providing source power to the primary processing chamber 102, greater control of species densities may be obtained. The source power may be inductive antennas 608, 708 or may be any other type or configuration of source power.

The embodiment of FIG. 9 may employ one or more charge particle filters. The filter may be interposed between collateral source chamber 502 or 504 and the primary processing chamber 102 at 916 or 917. By providing at least one filter to either of collateral source chambers 502, 504, even greater control of species densities may be obtained.

The embodiments of FIGS. 1, 3, 4, 6, 8–10 provide a non-exclusive means capable of controlling the densities of charged and neutral particle species without otherwise adjusting the density of the processing plasma. By controlling the species density of the collateral source plasma entering the processing chamber, by controlling the species densities of several collateral source chamber plasmas, or by controlling the species density of the collateral source plasma entering the processing chamber along with controlling the primary chamber generated plasma, the present invention provides separate control of the species densities. In addition, the overall density of the plasma, which would otherwise also be adjusted in a single chambered device, may be maintained. Furthermore, bias power may be applied to the workpiece for independent control of ion energy, which would otherwise also be affected by adjusting the species density within the primary processing chamber. In other words, the present invention allows control of species densities to be decoupled from control of plasma density and ion energy.

As discussed above, the present invention provides the ability to independently control species densities within the plasma to allow greater control of such process characteristics, for example, as etch rate, selectivity, etch feature profile, etch rate microloading, and removal of etch residues. In the etch metal residue example discussed above, the ratio of $Cl^+$ to $Cl_2^+$ may affect metal etch residue concentrations in the primary processing chamber 102. As such, by selectively reducing the amount of $Cl^+$ with respect to $Cl_2^+$, metal residue concentrations may be reduced in the primary processing chamber. By reducing metal etch residue concentrations, metal residue will not degrade processing or reactor components by redeposited on the workpiece surfaces or on the chamber surfaces. The present invention may also be employed to remove metal etch residues in other ways. The collateral source chamber may provide a Ligand to surround etched metal ions in the processing chamber, thereby effectively removing or eliminating such ions in the primary processing chamber. For example, a Ligand such as $C=O$, could be introduced into the primary processing chamber to surround metal residue, such as $Cu^+$, thereby effectively removing the $Cu^+$ in the primary processing chamber. Of course, other Ligands could be used and other types of metal ion residues may be removed in this manner.

It should also be noted it is not necessary to create a plasma to generate the Ligand. Ligands may be produced in any conventional manner that is well known to one skilled in the art, and provided to the primary processing chamber. As such, it is possible to employ the collateral source chamber to provide selected species of charged particles to the primary processing chamber, and to employ another apparatus or method, such as thermal dissociation, to create the Ligand input to the primary processing chamber.

Yet another example illustrating one of the possible ways to employ the present invention to improve processing characteristics includes introduction of polymers to the processing chamber during $SiO_2$ etch. Polymers can be used to provide a passivation layer to improve the aforementioned etch rate, selectivity, and etch feature profile characteristics.

Typically, a polymer gas, such as $C_2F_8$ are introduced into the primary chamber and dissociated along with the other process gases to form the desired passivation polymer specie of $CF_2$, along with other neutral and charged species within the primary processing chamber. The other species such as F, e, F+, etc., thereby add to the charged particle and neutral radical densities within the primary processing chamber. Therefore, in addition to adding passivation species, the dissociation of $C_2F_8$ adds other, reactive species to the processing plasma.

This may be avoided with the present invention. With the present invention, the primary processing plasma may be formed by generating a collateral plasma having selected, or filtered, species densities, as discussed above, and introduced to the primary source chamber without applying source power to the primary processing chamber. The desired polymer gas specie may be separately introduced to the primary processing chamber, so that it combines in the primary processing chamber with, filtered or unfiltered, collateral chamber plasma. Using this approach, the density of $CF_2$ may be increase without adding to the neutral and charged species generated by primary processing chamber source power. In this way, processing plasma species densities may be separately controlled, thereby improving process characteristics.

The $CF_2$ may be provided to the primary processing chamber in several ways. It may be provided by another collateral chamber, such as by generating an essentially totally ionized plasma, filtering by charged particle specie and by recombination, as discussed above. Or, it may be provided by other conventional techniques, such as by thermal dissociation.

Thermal dissociation techniques may be employed to produce any desired neutral species within the primary processing chamber. For example, thermal dissociation such as is employed in vapor deposition chambers may by utilized to provide neutral species. As such the present invention is will suited for use in plasma assisted chemical vapor deposition chambers.

It is also significant to note that the present invention may be employed to produce an essentially pure source of neutral or of charged particle specie. For example, the magnetically enhanced inductively coupled embodiment of the collateral chamber may be employed to produce essentially totally ionized plasma. The ions or charged particles may then be filtered, as discussed above, to produce an ion source containing essentially one specie of charged particles. This source may be delivered to the processing chamber.

As an alternative, this essentially one specie of charged particles may be combined with another different source of essentially pure oppositely charged particle specie so as to create an essentially pure neutral specie gas. Or, the essentially totally ionized particles may be filtered, as discussed above, so that only a single specie of positively charged particle remains, which can be filtered to recombine so as to create an essentially pure neutral specie gas. Alternatively, the essentially totally ionized plasma may be filtered so that only a single specie of positively charged particle and a specie of electrons remain. These two species may then be filtered so that the two species recombine to create an essentially pure neutral specie gas.

As such, the present invention provides numerous ways to control species densities. Furthermore, the present invention improves plasma assisted, and other types, of workpiece processing.

Figure 10:
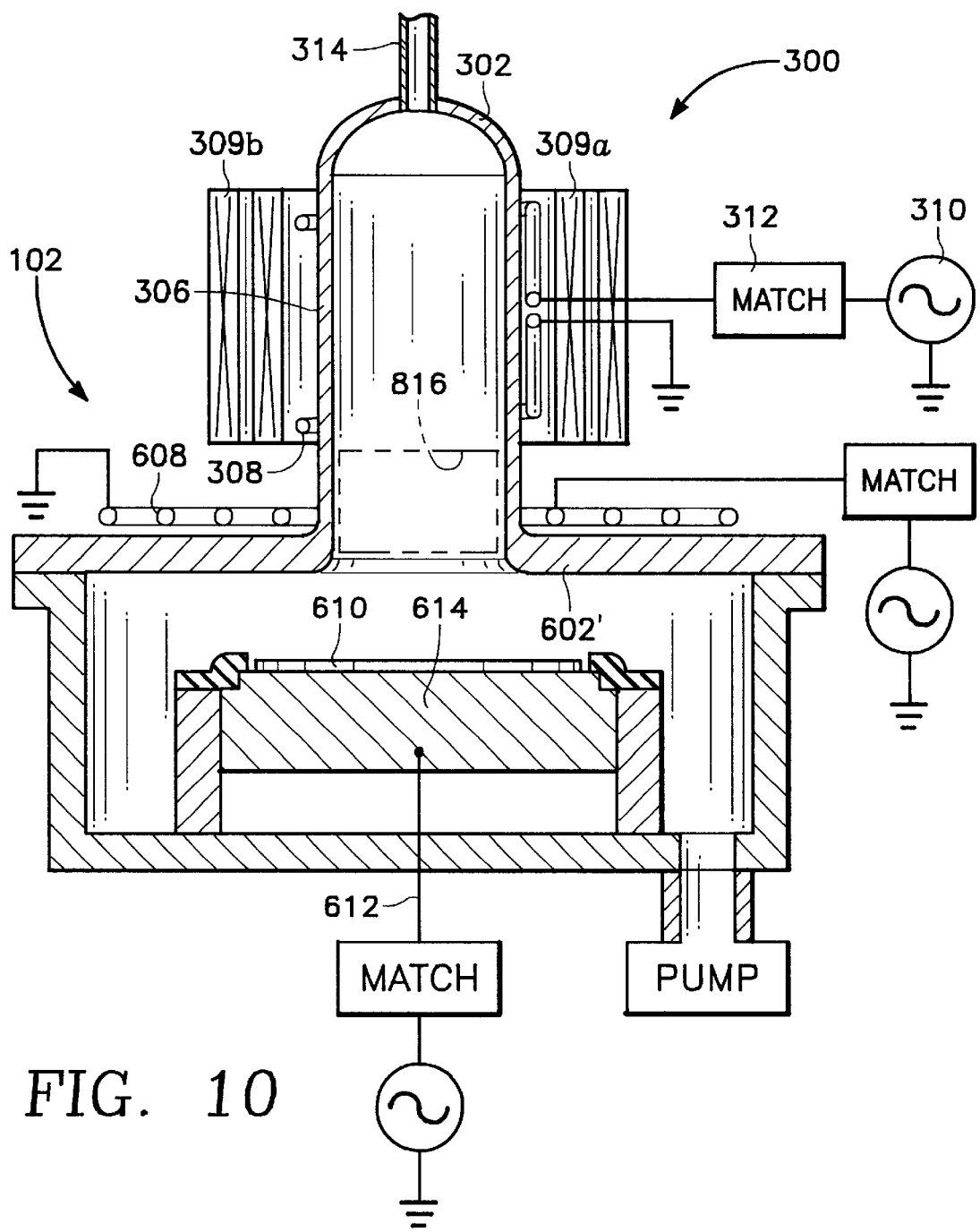
FIG. 10 is a cross-sectional, side view of the plasma reactor of FIG. 1 utilizing a magnetically enhanced inductively coupled collateral source chamber and an inductively coupled primary processing chamber having a flat ceiling.

Turning to FIG. 10, as discussed above, the primary processing chamber of the present invention is not limited to any specific configuration. FIG. 10 illustrates yet another non-exclusive example which provides separate control of species density. The primary processing chamber 102 has a flat top 602' with inductive antenna 608 shown overlaying the flat top 602'. As with the other embodiments of the primary processing chamber 102, the inductive antenna may also, or alternatively, surround the side wall of the primary processing chamber 102, not shown in FIG. 10. A capacitive bias 612 may be applied to the pedestal 614 to control ion energy at the workpiece 610. A filter may be interposed between the primary processing chamber 102 and the collateral source chamber 300 at 816 to further control the species densities as discussed above.

The distance of the workpiece 610 with respect to collateral source 300 plasma generation may be set to further control processing. For example, the distance from collateral source plasma generation to the workpiece may be increased if it is necessary to lower the density of collateral source plasma near the workpiece 610. Or, as another non-exclusive example, if a recombination filter is used at 816, and it is desired to ensure that neutral radicals will reach the workpiece 610 before combining, the distance from the workpiece 610 to collateral source plasma generation may be decreased to enhance processing. This may be accomplished by setting of height of the top 602' above the workpiece 610, such as by setting the height of the side walls of the primary processing chamber 102. Or, this may be accomplished by setting the height of the wall 306 of the collateral source chamber 300. In addition, the pedestal 614 may be adjusted to set the distance of the workpiece 610 with respect to plasma generation in the collateral source chamber 300. Other embodiments of the present invention may also employ these features to facilitate processing.

FIGS. 4, 6, and 8–10 illustrate the collateral chamber with a source power applicator capable of generating a helicon wave to generate the collateral plasma. Although any type of source power applicator may be used to generate the collateral plasma, among other advantages, the source power applicator capable of generating a helicon wave allows a uniform high density plasma to be generated in the collateral chamber over a larger range of temperatures and pressures. This allows the present invention to be employed over a larger process window for both etching and deposition processes.

Some attributes and examples of helicon wave plasma generation devices are disclosed in U.S. Pat. Nos. 4,990,229 and 5,421,891 and 5,429,070, all by Campbell et al., all entitled HIGH DENSITY PLASMA DEPOSITION AND ETCHING APPARATUS, issued Feb. 5, 1991 and Jun. 6, 1995 and Jul. 4, 1995 respectively, all herein incorporated by reference in their entireties.

To form the collateral chamber source power applicator, typically a double loop antenna 308 is disposed around the cylinder of a bell chamber 306 so as to create an m=0 helicon wave. An RF source generator 310 provides current through each of the loops so that the current in one loop passes in a clockwise manner while the current in the other loop passes in a counterclockwise manner to produce currents 180 degrees out of phase. In this embodiment, the collateral source power applicator also includes nested electromagnets 309a & 309b which provide an axial magnetic field within the collateral chamber 300. The current in the inner 309a and outer magnets 309b may be adjusted to provide a magnetic field which diverges rapidly outside the collateral chamber cylinder.

The axial magnetic field in the collateral chamber directs the plasma to the processing chamber where it diverges into the processing chamber. This divergence also serves to keep the magnetic field away from the workpiece.

The interaction between the axial magnetic field and the induced RF electric field within the cylinder gives rise to the helicon wave within the collateral chamber. The helicon wave propagates according to the dispersion relation and in accordance with Landau damping into the processing chamber, toward the workpiece, which typically is located 10 cm or more from the collateral chamber-to-processing chamber coupling. This distance, as discussed earlier is adjustable to optimize processing and is dependent upon the selected processing parameters.

The collateral chamber 300 may be made of quartz and have a diameter of 10 cm with the optimum distance between loops being such that the time taken for the induced helicon wave to propagate between the two loops is ½ of the RF period (about 12.5 cm for 13.56 MHZ). The collateral chamber may operate over a wide range of RF source power (0.5–3.0 kW), magnetic field strength (30–300 G), and pressures (0.5–50 mT). The collateral chamber is not limited to the above described layout to produce an m=0 helicon wave. Also, other antenna configurations may be employed to generate other modes of helicon waves, such as m=1, to form the collateral plasma.

An advantage of a helicon source is that by adjusting plasma parameters, the helicon wave source power applicator may provide ionization rates approaching 100%. This provides an advantage over other type source power applicators when the collateral chamber is selected to provide primarily charged particles to the primary chamber, either filtered or unfiltered. Additionally, high ionization rates are advantageous when the collateral chamber is selected to produce neutral particles using recombination type filters. The high ionization rate will assist in generating more of the desired plasma species to be supplied to the primary chamber.

In addition, the dense plasma formed by the helicon wave source power applicator allows plasma generation to be moved farther from the workpiece without deleteriously reducing plasma density. Thus, sufficient amounts of neutral or charge particle species may be delivered to the primary chamber before recombining.

Moreover, a source power applicator capable of generating a helicon wave provides efficient coupling of source power and allows for highly uniform plasma generation over a wide range of pressure and source power. The uniform nature of plasma generated by helicon wave in a magnetic field, allows the plasma to flow into the primary chamber to produce a more uniform processing plasma.

In furtherance of a uniform processing plasma and species density control, a primary chamber source power applicator may be provided adjacent the primary chamber. The primary processing chamber source power may be used to ignite a process gas supplied to the primary chamber to generate the processing plasma in the primary chamber. The collateral plasma may be introduced into the primary chamber and added to the ignited process gas so that the ignited process gas and the collateral plasma form the processing plasma in the primary chamber.

The collateral plasma, therefore, may be formed of primarily neutral radicals or primarily charged particles. Adjusting the collateral chamber parameters, such as source power, provides control of the density of the neutral and charged particles within the collateral plasma. The collateral chamber, therefore, can be a source of neutral radical species to the primary processing chamber or a source of charged particle species.

As discussed above, the densities of the neutral and charged particle species of the collateral plasma are selected to produce the desired species density in the primary chamber. The collateral plasma, therefore, modulates the species densities within the primary chamber. Furthermore, the filter may be interposed between the collateral source chamber and the primary chamber, as discussed above, to further control collateral plasma species densities and thereby allow further modulation and provide further control of the processing plasma species densities.

The present invention, therefore, allows decoupling control of processing plasma species densities from overall density. One way the present invention provides for decoupling control of overall density and species densities of the processing plasma is by applying source power to the collateral chamber and to the primary processing chamber. The collateral plasma added to the primary chamber with source power applied thereby forms the processing plasma. Another way to achieve decoupling of overall density and species densities is by applying source power to a first collateral chamber and a second collateral chamber and combining the plasmas in the primary chamber to form a processing plasma. Yet another way to achieve decoupling of overall density and species densities is by applying source power to the collateral chamber and by filtering the collateral chamber plasma to form the processing plasma in the primary chamber. Still another way to achieve decoupling of overall density and species densities is to apply source power to a collateral chamber and supply a separate source of neutral species to the primary chamber, such as thermally dissociated species, to form the processing plasma in the primary chamber.

Additionally, applying bias power to the workpiece allows the present invention to decouple control of ion energy from species densities and from overall density of the processing plasma.

It should be noted that with the present invention, process gas may be introduced to the collateral chamber only, to the collateral chamber and the primary chamber both, or to the primary chamber only for processing the workpiece. It should also be noted that source power may be applied to both the primary chamber and the collateral source chamber during workpiece processing. Such contemporaneous application of source power to the collateral source chamber and to the primary processing chamber for processing the workpiece, may be continuous or pulsed and may alternate between chambers if desired.

What we claimed is:

1. A plasma reactor comprising:
   a) a processing chamber comprising therewith a source power applicator capable of sustaining a processing plasma within the processing chamber, the processing chamber being adapted to hold a workpiece exposed to the processing plasma, the processing chamber further comprising a separate bias power applicator capable of providing bias power to the workpiece;
   b) a collateral chamber coupled to the processing chamber and comprising therewith a helicon source power applicator capable of generating a collateral plasma using a helicon wave; and
   c) a filter disposed between the collateral chamber and the processing chamber.

2. The plasma reactor of claim 1, wherein the processing plasma is comprised of species of neutral and charged particles having densities, and wherein the collateral chamber source power applicator and the filter are configured so that substantially only charged particles are provided to the primary processing plasma from the collateral source chamber.

3. The plasma reactor of claim 1, wherein the processing plasma is comprised of species of neutral and charged particles having densities, and wherein the collateral chamber source power applicator and the filter are configured so that substantially only charged particles having a selected charge-to-mass ratio are provided to the primary processing plasma from the collateral source chamber.

4. The plasma reactor of claim 1, wherein the processing plasma is comprised of species of neutral and charged particles having densities, and wherein the collateral chamber source power applicator and the filter are configured so that substantially only neutral particles are provided to the primary processing plasma from the collateral source chamber.

5. The plasma reactor of claim 1, wherein the processing plasma is comprised of species of neutral and charged particles having densities, and wherein the collateral chamber source power applicator and the filter are configured so that substantially only neutral particles having a selected mass are provided to the primary processing plasma from the collateral source chamber.

6. The plasma reactor of claim 5 wherein the filter comprises a quadrupole and at least one of a neutralizing grid or a conduit.

7. The plasma reactor of claim 1 wherein the processing chamber comprises an inductive antenna.

8. The plasma reactor of claim 7 wherein the processing chamber further comprises a ceiling, and wherein the collateral chamber is coupled to the processing chamber ceiling.

9. The plasma reactor of claim 1 further comprising a plurality of process gas sources, and wherein all of the process gas sources are coupled to the collateral chamber.

10. The plasma reactor of claim 1 further comprising a plurality of process gas sources, and wherein at least one of the process gas sources is coupled to the collateral chamber, and wherein at least one of the process gas sources is coupled to the processing chamber.

11. The plasma reactor of claim 10 wherein the plurality of process gas sources are adapted to simultaneously supply process gas to the processing chamber and the collateral chamber.

12. The plasma reactor of claim 10 wherein the plurality of process gas sources supply process gases for processing a workpiece.

13. The plasma reactor of claim 1 wherein the processing chamber source power applicator and the collateral chamber source power applicator are adapted to be simultaneously powered.

14. The plasma reactor of claim 1 further comprising a processing plasma formed within the processing chamber by the application of source power to both the processing chamber source power applicator and the collateral chamber source power applicator.

15. The plasma reactor of claim 14 wherein the processing plasma is formed from at least one process gas introduced into the collateral chamber and at least one process gas introduced into the primary chamber.

16. The plasma reactor of claim 1, wherein the processing chamber source power applicator comprises an inductive coil antenna.

17. The plasma reactor of claim 1 wherein the filter is adapted to admit substantially only neutral particles from the collateral chamber to the processing chamber.

18. The plasma reactor of claim 1 wherein the filter is adapted to admit neutral particles based on mass from the collateral chamber to the processing chamber.

19. The plasma reactor of claim 18 wherein the filter comprises a quadrupole and at least one of a neutralizing grid or a conduit.

20. The plasma reactor of claim 1 wherein the filter is adapted to admit charged particles from the collateral chamber to the processing chamber.

21. The plasma reactor of claim 1 wherein the filter is adapted to admit charged particles based on charge-to-mass ratio from the collateral chamber to the processing chamber.

22. The plasma reactor of claim 1 wherein the filter comprises at least one of: a conduit, a neutralizing grid, a biased grid, a magnet, or a quadrupole.

23. The plasma reactor of claim 1 wherein the collateral chamber comprises at least one of: a microwave discharge apparatus, an inductive discharge apparatus, or a capacitive discharge apparatus.

24. The plasma reactor of claim 23 wherein the processing chamber source power applicator comprises an inductive coil antenna.

* * * * *